US012745451B2

(12) United States Patent
Lee et al.

(10) Patent No.: US 12,745,451 B2
(45) Date of Patent: Sep. 22, 2026

(54) SEMICONDUCTOR DEVICE

(71) Applicant: SAMSUNG ELECTRONICS CO., LTD., Suwon-si (KR)

(72) Inventors: Jinwoo Lee, Seoul (KR); Yunse Oh, Anseong-si (KR); Byung-Sung Kim, Suwon-si (KR); Sutae Kim, Suwon-si (KR); Seung Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1031 days.

(21) Appl. No.: 17/868,401

(22) Filed: Jul. 19, 2022

(65) Prior Publication Data

US 2023/0079697 A1 Mar. 16, 2023

(30) Foreign Application Priority Data

Sep. 15, 2021 (KR) ........................ 10-2021-0123062

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |

(Continued)

(52) U.S. Cl.

CPC ........... *H10D 84/85* (2025.01); *H10D 30/014* (2025.01); *H10D 30/031* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/017* (2025.01); *H10D 84/0167* (2025.01);

(Continued)

(58) Field of Classification Search

CPC .. H10D 84/85; H10D 30/014; H10D 30/6735; H10D 64/017; H01L 21/02603

See application file for complete search history.

(56) References Cited

U.S. PATENT DOCUMENTS

| | | |
|---|---|---|
| 7,174,532 B2 | 2/2007 | Chlipala et al. |
| 9,331,199 B2 | 5/2016 | Cho et al. |

(Continued)

FOREIGN PATENT DOCUMENTS

| | | |
|---|---|---|
| KR | 10-2018-0031855 A | 3/2018 |
| KR | 10-2018-0136616 A | 12/2018 |
| KR | 10-2021-0014829 A | 2/2021 |

*Primary Examiner* — Jacob Y Choi
*Assistant Examiner* — Aaron Michael Wegner
(74) *Attorney, Agent, or Firm* — Sughrue Mion, PLLC

(57) ABSTRACT

Disclosed is a semiconductor device including: a substrate including a first active pattern separated into a pair of first active patterns by a trench; a device isolation layer filling the trench; first source/drain patterns on the first active pattern; a first channel pattern connected to the first source/drain patterns and including semiconductor patterns; a first dummy gate electrode that extends while being adjacent to a first sidewall of the trench; a gate electrode that is spaced apart in the first direction from the first dummy gate electrode and extends while running across the first channel pattern, a gate capping pattern on the gate electrode; a gate contact coupled to the gate electrode; and a separation pattern extending between the gate electrode and the first dummy gate electrode. A top surface of the separation pattern is at a same level as that of the gate capping pattern.

20 Claims, 40 Drawing Sheets

(51) Int. Cl.

| | |
|---|---|
| ***H10D 62/13*** | (2025.01) |
| ***H10D 64/01*** | (2025.01) |
| ***H10D 84/01*** | (2026.01) |
| ***H10D 84/03*** | (2025.01) |
| ***H10P 14/20*** | (2026.01) |

(52) U.S. Cl.

CPC ....... *H10D 84/017* (2025.01); *H10D 84/0188* (2025.01); *H10D 84/038* (2025.01); *H10P 14/3462* (2026.01)

(56) References Cited

U.S. PATENT DOCUMENTS

| | | | | |
|---|---|---|---|---|
| 9,337,318 | B2 | 5/2016 | Liu et al. | |
| 9,831,272 | B2 | 11/2017 | Chen et al. | |
| 9,929,160 | B1 | 3/2018 | Lee et al. | |
| 9,978,745 | B2 | 5/2018 | Wang et al. | |
| 10,347,627 | B2 | 7/2019 | Cho et al. | |
| 10,679,994 | B1 | 6/2020 | Yang | |
| 10,726,186 | B2 | 7/2020 | Kim et al. | |
| 10,804,257 | B2 | 10/2020 | Lee et al. | |
| 10,861,934 | B2 | 12/2020 | Maeda et al. | |
| 11,195,928 | B2 | 12/2021 | Lim et al. | |
| 2018/0083007 | A1* | 3/2018 | Lee | H10D 84/017 |
| 2018/0366463 | A1* | 12/2018 | Cho | H10D 84/834 |
| 2020/0243523 | A1* | 7/2020 | Lee | H10D 84/0158 |

* cited by examiner

AP1
PR
100
GC
NR
AP2
GE
AC
DB
SD1
DGE
IR
SD2
LC1
LC2
A
A'
B
B'
C
C'
D
D'
D1
D2
D3

M2
M1
AP2
CH2
UIP
GP
GS
GI
GE(PO4)
SP3
SP2
SP1
FM
BM
GC
M2_I
VI2
VI1
M1_I
SD2
SC
IP
PO1 PO2 PO3
GE
RS2
DB
110
DGE
UP DGS
(DGE)
DGI
SW2
ST
TR2
PT
(DGE)
VP
(DGE)
SW1
LC2
IR
LC1
SP1 SP2 SP3
140
130
120
AC
100
B
B'
D2
D3

D3
D1
AP2
M2
M1
M2_I
D'
SP3
SP2
SP1
CH2
NR
GC
FM
BM
TS
SIW
BS
SP3
SP2
SP1
CH1
TR1
TR2
PR
M1_I
VI1
VI2
140
130
120
GP
P04
P03
P02
P01
GE
GI
AP1
ST
100
D

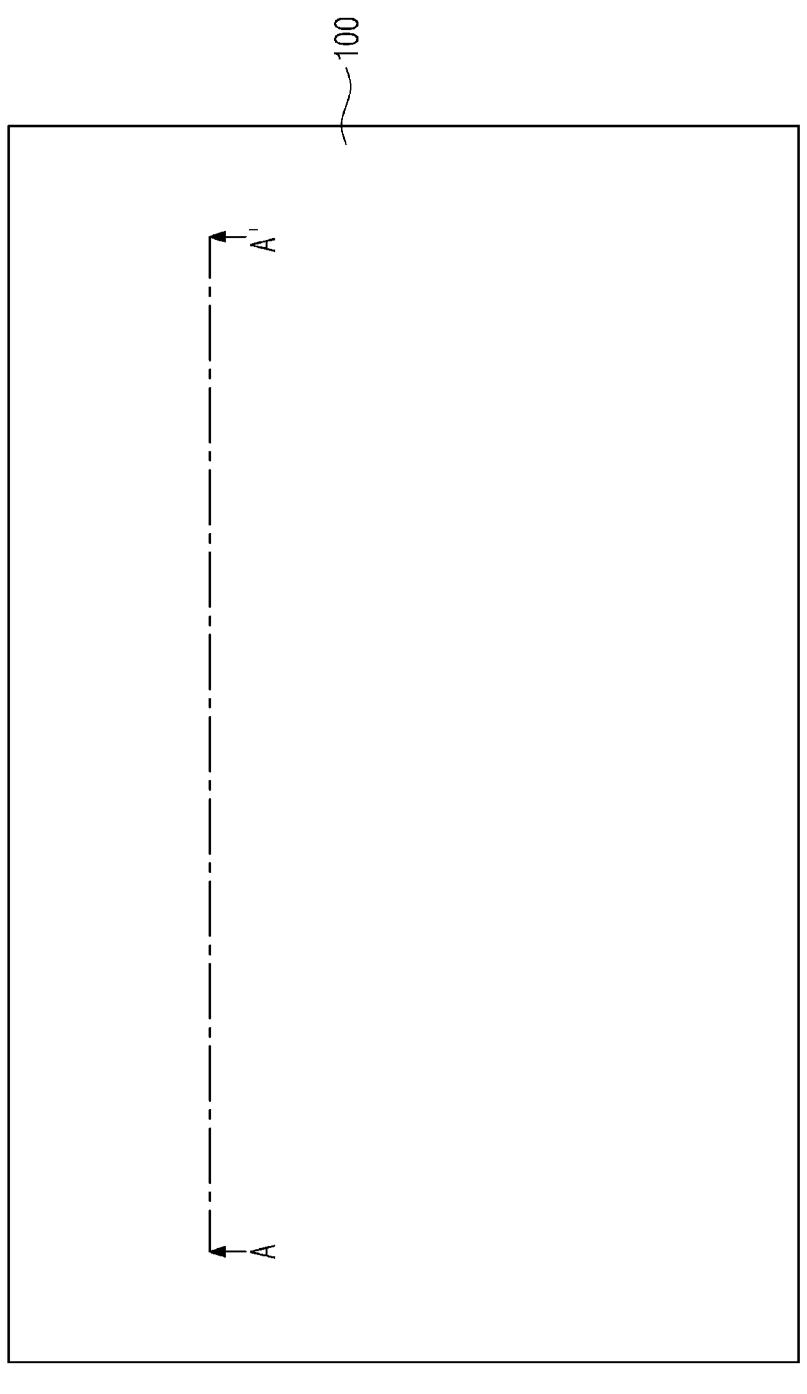
FIG. 4
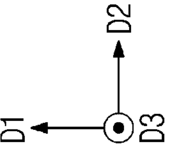

AP1
100
AP2
A'
LC2
IR
B
B'
LC1
A
AP1
AP2
D2
D1
D3

D3
D1
AP2
C'
SD2
NR
SD1
TR1
TR2
PR
110
AP1
ST
100
C

AP1
GP
GS
GI
GE(PO4)
SP3
SP2
SP1
CH1
SD1
PO1 PO2 PO3
GE
RS1
LC2
SW2
ST
TR2
110 DGE
UP DGS
(DGE)
DGI
PT (DGE)
VP (DGE)
SW1
IR
110
SP1 SP2 SP3
CH1
LC1
PO3
PO2
PO1
100
A
A'
D2
D3

AP1
PR
100
NR
AP2
A'
B'
GE
DB
SD1
DGE
IR
SD2
LC2
LC1
A
B
D1
D2
D3

AP1
GP
GS
GI
GE(PO4)
SP3
SP2
SP1
CH1
SD1
PO1 PO2 PO3
GE
RS1
DB
SW2
ST
TR2
110 DGE
UP DGS
DGI(DGE)
PT (DGE)
VP (DGE)
SW1
110
SP1 SP2 SP3
CH1
PO3
PO2
PO1
100
A
A'
LC1
IR
LC2
D2
D3

AP2
CH2
GP
GS
GI
GE(PO4)
SP3
SP2
SP1
B'
IP
SD2
PO1 PO2 PO3
GE
RS2
LC2
DB
SW2
ST
TR2
110 DGE
UP DGS
DGI (DGE)
PT (DGE)
VP (DGE)
SW1
IR
110
SP1 SP2 SP3
LC1
PO3
PO2
PO1
100
B
D2
D3

M2
M1
AP2
CH2
UIP
GP
GS
GI
GE(P04)
SP3
SP2
SP1
FM
BM
GC
M2_I
VI2
VI1
M1_I
SD2
SC
IP
P03
P01 P02
GE
RS2
110
DGE
SW2
ST
TR2
UP DGS
(DGE)
DGI
PT
(DGE)
VP
(DGE)
SW1
LC2
IR
LC1
SP1 SP2 SP3
140
130
120
AC
100
B
B'
D2
D3

M2_I
M2_I
M1_I
140
VI2
VI2
M2
M1_I
UP DGS
DGI (DGE)
110 DGE
110
M1
130
VI1
FM
BM
GC
VI1
120
UIP
GP
GS
GI
GE(PO4)
AC
FM
BM
GE
PO3
PO2
PO1
SD1
SD1
SD1
SD1
SD1
SD1
SP3
SP2
SP1
CH1
AP1
SC
SP1 SP2 SP3
CH1
RS1
PT
(DGE)
PO1 PO2 PO3
GE
RS1
SC
SW2
ST
TR2
VP
(DGE)
SW1
D3
D2
100
A
A'
LC1
IR
LC2

M2_I
VI1
VI1
M2_I
M1_I
140
VI2
VI2
M2
M1_I
GS
UP DGS
DGI (DGE)
110 DGE
110
M1
130
GC
FM
BM
VI1
120
UIP
GP
GS
GI
GE(PO4)
AC
FM
BM
GE
PO3
PO2
PO1
SD1
SP3
SP2
SP1
CH1
AP1
SC
RS1
PT
(DGE)
VP
(DGE)
SW1
SW2
ST
TR2
PO1 PO2 PO3
100
D3
D2
A
A'
LC1
IR
LC2

M2
M1
GP
GS
GI
GE
AP1
M1_I
M2_I
CH1
SD1
VI2
VI1
RS1
DB
110
SW2
ST
TR2
DGE
UP DGS
(DGE)
DGI
VP
(DGE)
SW1
GS
GC
FM
BM
140
M1_I
130
120
UIP
SC
AC
100
A
A'
LC1
LC2
IR
D2
D3

SEMICONDUCTOR DEVICE

CROSS-REFERENCE TO RELATED APPLICATION

This application is based on and claims priority from Korean Patent Application No. 10-2021-0123062 filed on Sep. 15, 2021 in the Korean Intellectual Property Office, the disclosure of which is hereby incorporated in its entirety by reference.

BACKGROUND

The disclosure concepts relate to a semiconductor device, and more particularly, to a semiconductor device including a field-effect transistor.

A semiconductor device includes an integrated circuit including metal oxide semiconductor field effect transistors (MOSFETs). As sizes and design rules of the semiconductor device are gradually decreased, sizes of the MOSFETs are also increasingly scaled down. The scale down of MOSFETs may deteriorate operating characteristics of the semiconductor device. Accordingly, various studies have been conducted to develop methods of manufacturing semiconductor devices having superior performance while overcoming issues associated with high integration of the semiconductor devices.

SUMMARY

Various embodiments provide a semiconductor device with increased electrical properties.

According to embodiments, a semiconductor device may include: a substrate including a first active pattern that extends in a first direction, the first active pattern being separated into a pair of first active patterns by a trench extending in a second direction that intersects the first direction; a device isolation layer that fills a lower portion of the trench; a plurality of first source/drain patterns on the first active pattern; a first channel pattern connected to the first source/drain patterns, the first channel pattern including a plurality of semiconductor patterns that are stacked and spaced apart from each other; a first dummy gate electrode that extends in the second direction while being adjacent to a first sidewall of the trench; a gate electrode spaced apart in the first direction from the first dummy gate electrode, the gate electrode extending in the second direction while running across the first channel pattern; a gate capping pattern on the gate electrode; a gate contact coupled to the gate electrode; and a separation pattern that extends in the second direction between the gate electrode and the first dummy gate electrode. A top surface of the separation pattern may be at a same level as a top surface of the gate capping pattern.

According to some embodiments, a semiconductor device may include: a first logic cell and a second logic cell on a substrate, the first logic cell and the second logic cell being spaced apart from each other in a first direction; an isolation region between the first logic cell and the second logic cell; a first active pattern on the first logic cell and a second active pattern on the second logic cell; a first channel pattern on the first active pattern, and a second channel pattern on the second active pattern; a trench on the isolation region; a first dummy gate electrode that is adjacent to a first sidewall of the trench and extends in a second direction intersecting the first direction; a gate electrode that extends in the second direction on the first logic cell and is spaced apart in the first direction from the first dummy gate electrode; and a separation pattern between the gate electrode and the first dummy gate electrode, the separation pattern extending in the second direction. A first gate spacer may be on an upper sidewall of the separation pattern.

According to some embodiments, a semiconductor device may include: a substrate including a first logic cell, a second logic cell, and an isolation region between the first logic cell and the second logic cell, the first logic cell and the second logic cell being adjacent to each other in a first direction; a trench on the isolation region, the trench having a first sidewall adjacent to the first logic cell and a second sidewall adjacent to the second logic cell; a device isolation layer that fills a lower portion of the trench; a first active pattern and a second active pattern on the first logic cell and the second logic cell, respectively; a plurality of first source/drain patterns and a plurality of second source/drain patterns on the first active pattern and the second active pattern, respectively; a first channel pattern and a second channel pattern connected to the plurality of first source/drain patterns and the plurality of second source/drain patterns, respectively, each of the first and second channel patterns including a first semiconductor pattern, a second semiconductor pattern, and a third semiconductor pattern that are sequentially stacked and spaced apart from each other; a first dummy gate electrode on the first sidewall of the trench, the first dummy gate electrode extending in a second direction that intersects the first direction; a second dummy gate electrode on the second sidewall of the trench, the second dummy gate electrode extending in the second direction; a first gate electrode and a second gate electrode that extend in the second direction while running across the first channel pattern and the second channel pattern, respectively, each of the first and second gate electrodes including a first part between the substrate and the first semiconductor pattern, a second part between the first semiconductor pattern and the second semiconductor pattern, a third part between the second semiconductor pattern and the third semiconductor pattern, and a fourth part on the third semiconductor pattern; a gate dielectric layer between the first channel pattern and the first gate electrode and between the second channel pattern and the second gate electrode; a dummy gate dielectric layer between the first channel pattern and the first dummy gate electrode and between the second channel pattern and the second dummy gate electrode; a first gate spacer on each of sidewalls of the first and second gate electrodes; a dummy gate spacer on each of sidewalls of the first and second dummy gate electrodes; a gate capping pattern on each of top surfaces of the first and second gate electrodes; a first separation pattern that extends in the second direction between the first gate electrode and the first dummy gate electrode; a first interlayer dielectric layer on the gate capping pattern; an active contact that penetrates the first interlayer dielectric layer and is coupled to one of the first and second source/drain patterns; a gate contact that penetrates the first interlayer dielectric layer and is coupled to one of the first and second gate electrodes; a second interlayer dielectric layer on the first interlayer dielectric layer; a first metal layer in the second interlayer dielectric layer; a third interlayer dielectric layer on the second interlayer dielectric layer; and a second metal layer in the third interlayer dielectric layer. A top surface of the first separation pattern may be at a same level as a top surface of the gate capping pattern.

BRIEF DESCRIPTION OF DRAWINGS

FIGS. 4, 6, 8, 10, 12, 14, and 16 illustrate plan views showing a method of fabricating a semiconductor device, according to embodiments.

DETAILED DESCRIPTION OF EMBODIMENTS

The embodiments described herein are example embodiments, and thus, the inventive concept is not limited thereto and may be realized in various other forms.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

It will be understood that, although the terms first, second, third, fourth, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
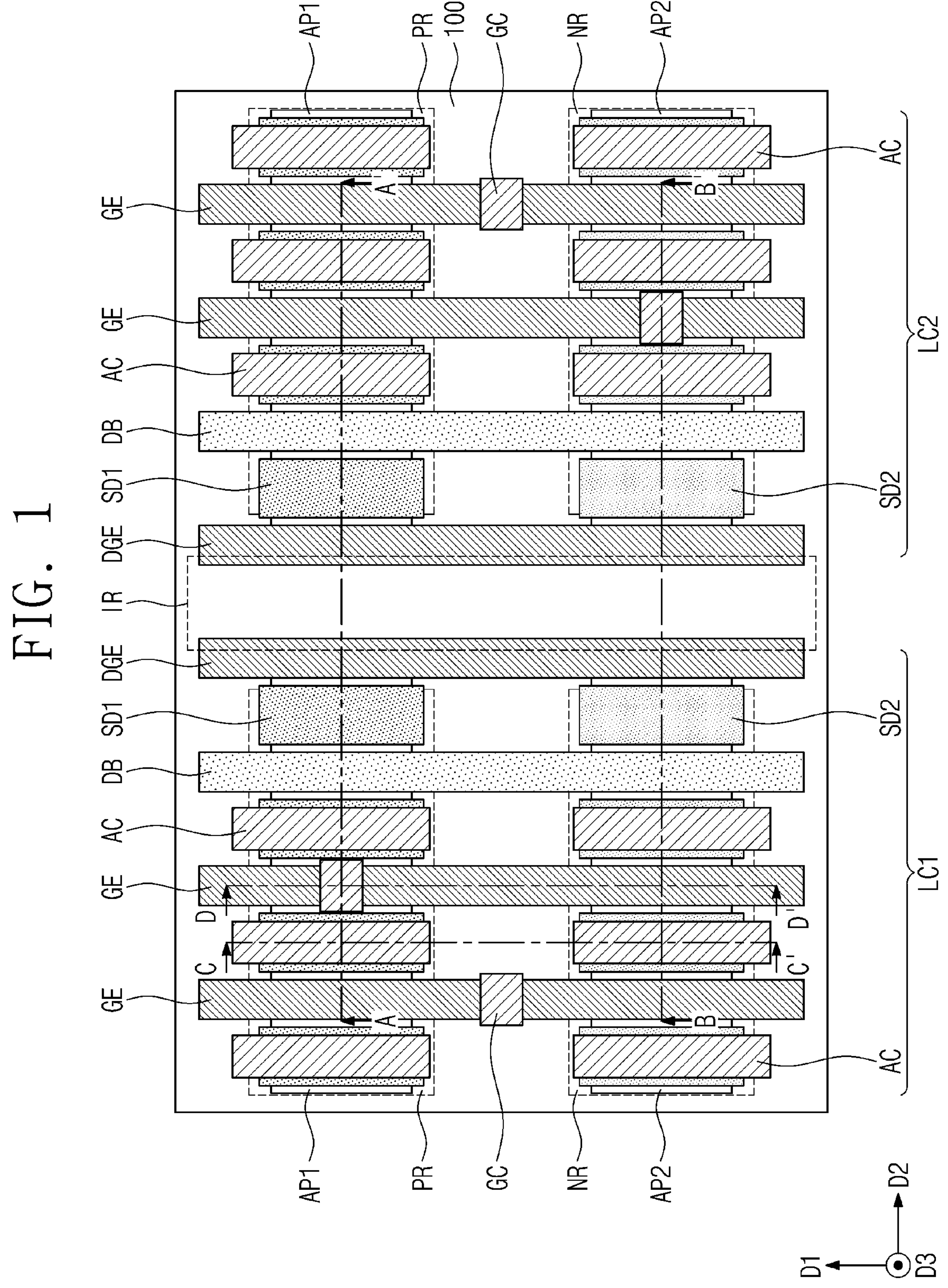
FIG. 1 illustrates a plan view showing a semiconductor device according to embodiments.

FIG. 1 illustrates a plan view showing a semiconductor device according to embodiments. FIGS. 2A, 2B, 2C, and 2D illustrate cross-sectional views respectively taken along lines A-A', B-B', C-C', and D-D' of FIG. 1.

Referring to FIGS. 1 and 2A to 2D, a first logic cell LC1 and a second logic cell LC2 may be provided on a substrate 100. The first logic cell LC1 and the second logic cell LC2 may be arranged in a second direction D2. Each of the first and second logic cells LC1 and LC2 may constitute a logic circuit. For example, each of the first and logic cells LC1 and LC2 may include logic transistors included in the logic circuit. In the present embodiment, the first and second logic cells LC1 and LC2 may include the same or different logic circuits.

The substrate 100 may include a p-type MOSFET (PMOS) region PR and an n-type MOSFET (NMOS) region NR. Each of the first and second logic cells LC1 and LC2 may include the PMOS region PR and the NMOS region NR that extend in the second direction D2. The substrate 100 may be a semiconductor substrate. For example, the substrate 100 may be a silicon substrate, a germanium substrate, or a silicon-on-insulator (SOI) substrate.

Figure 2A:
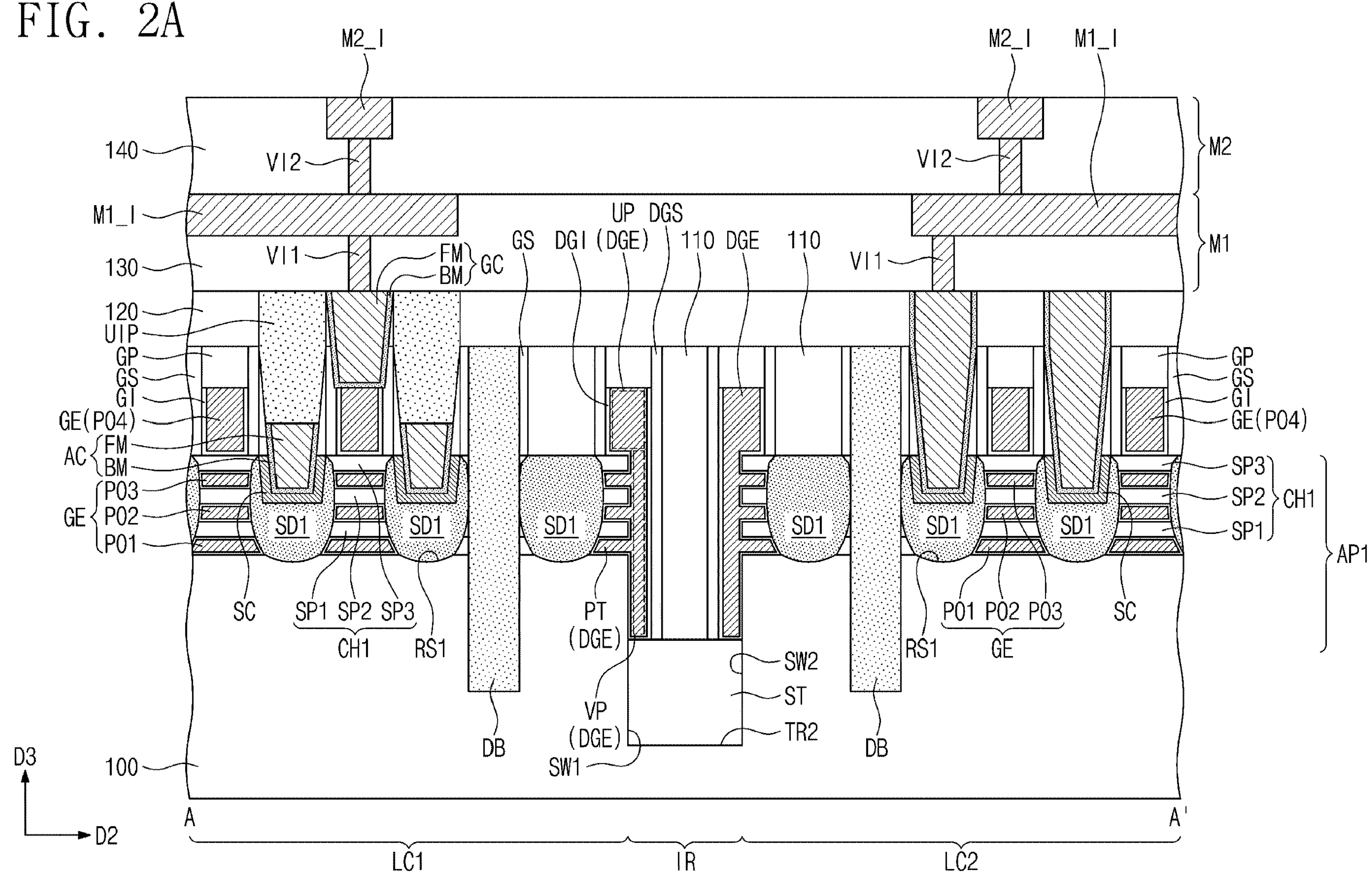
FIGS. 2A, 2B, 2C, and 2D illustrate cross-sectional views respectively taken along lines A-A', B-B', C-C', and D-D' of FIG. 1.
Figure 2B:
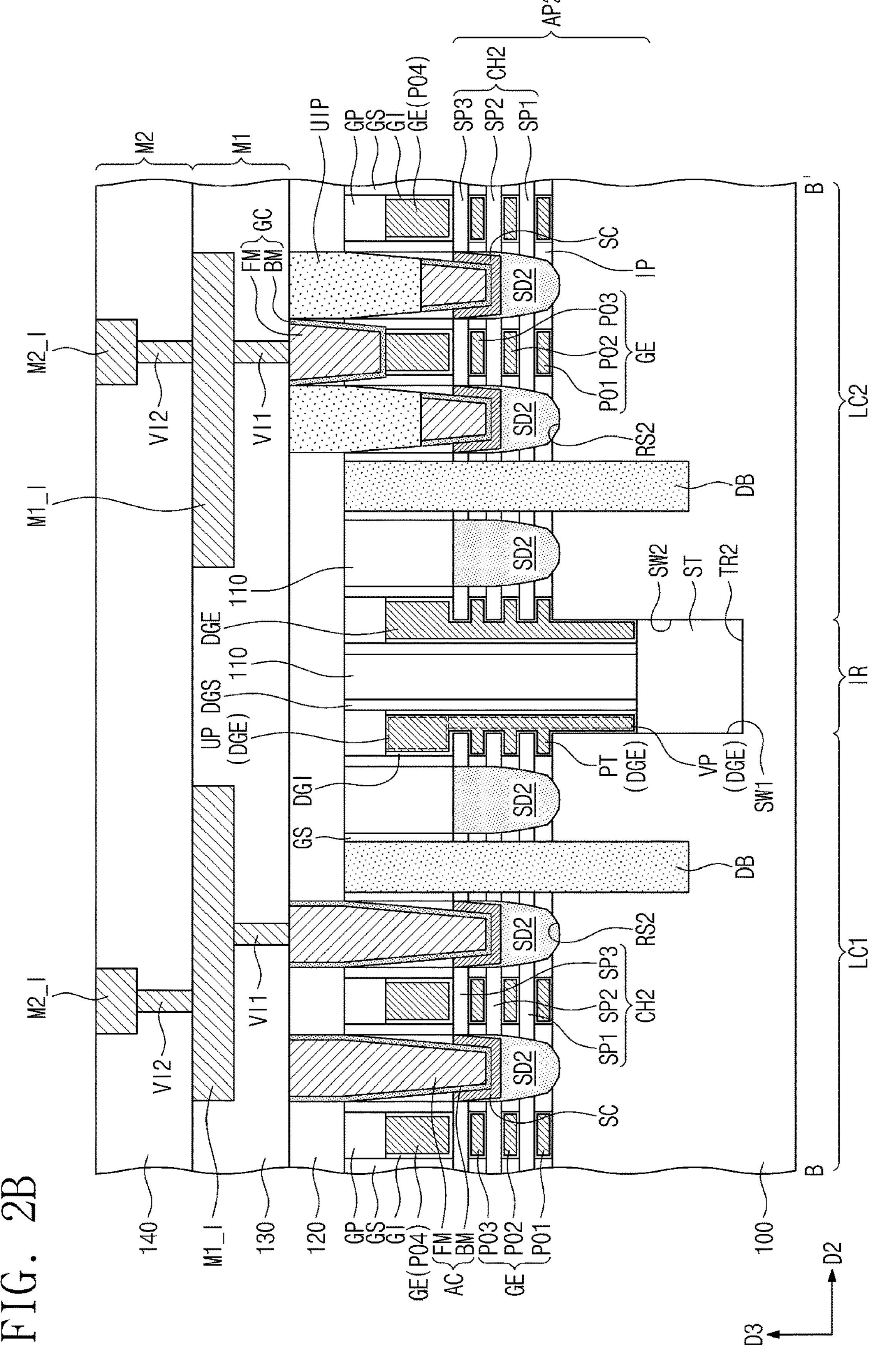
Figure 2C:
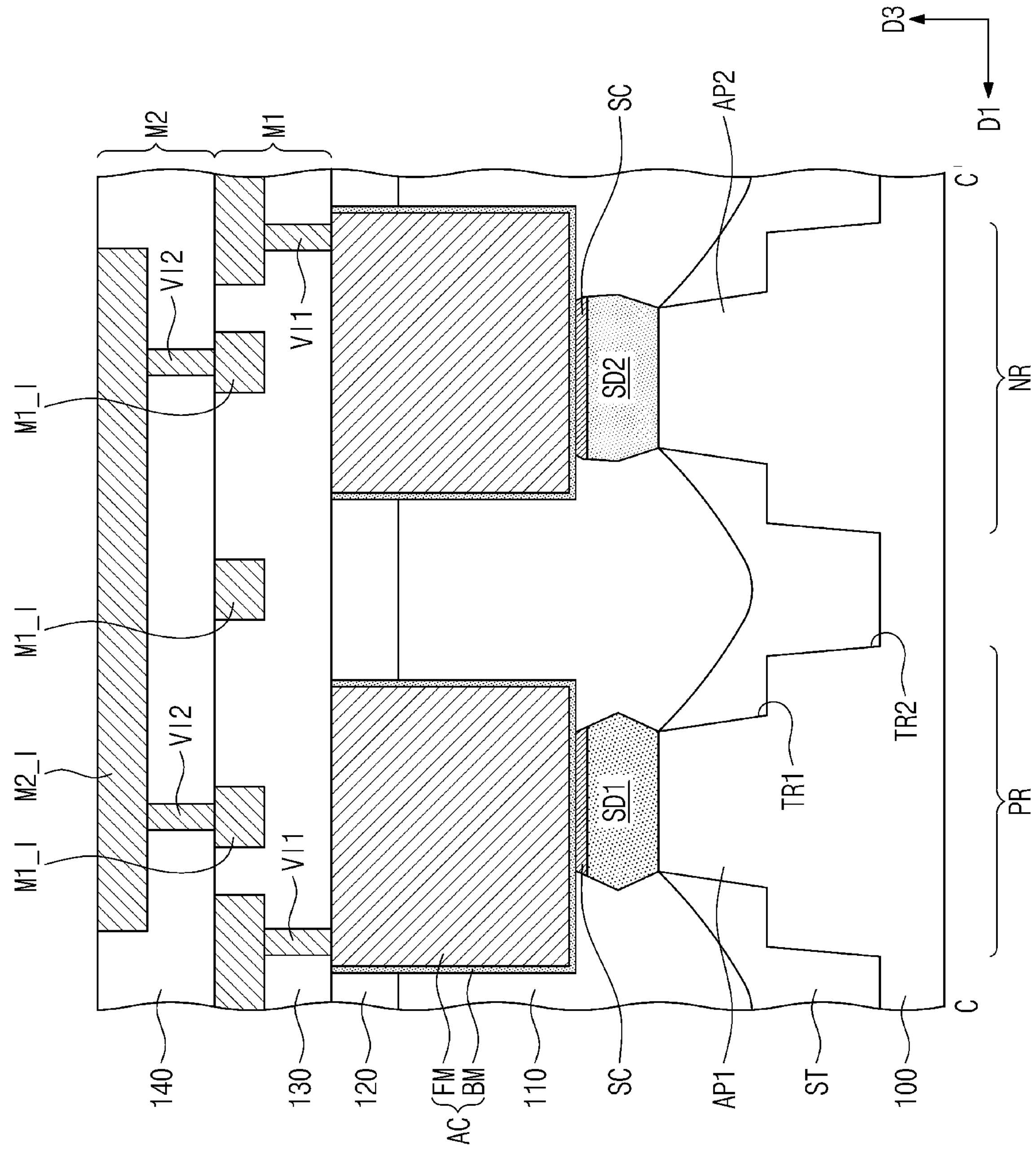
Figure 2D:
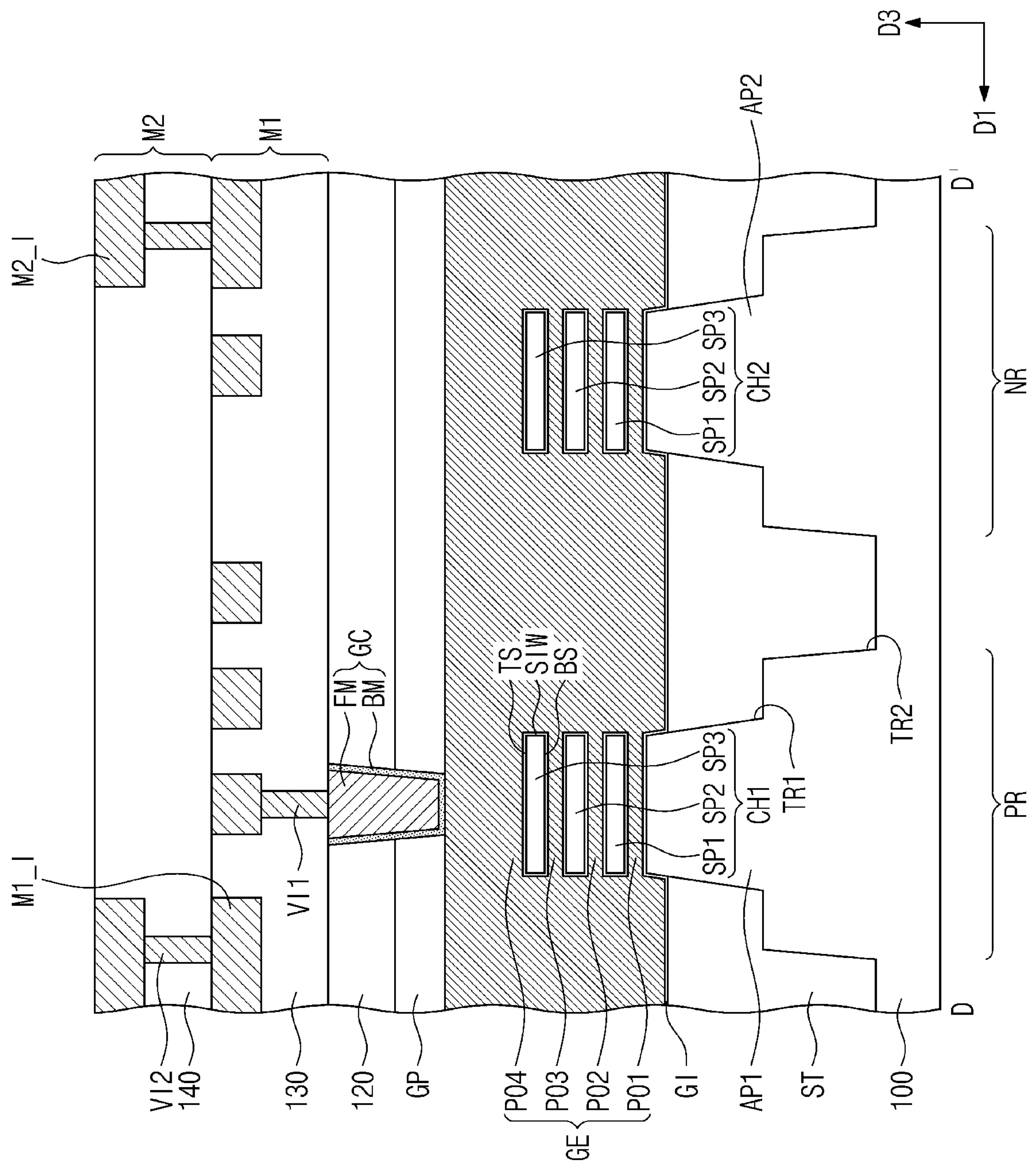

The PMOS region PR and the NMOS region NR may be defined by a second trench TR2 formed on an upper portion of the substrate 100 (FIGS. 2C and 2D). For example, the second trench TR2 may be positioned between the PMOS region PR and the NMOS region NR. The PMOS region PR and the NMOS region NR may be spaced apart from each other in a first direction D1 across the second trench TR2.

The substrate 100 may include an isolation region IR between the first logic cell LC1 and the second logic cell LC2. The second trench TR2 may extend in the first direction D1 on the isolation region IR. For example, when viewed in plan, the second trench TR2 may include a part that extends in the first direction D1 and a second part that extends in the second direction D2. The second trench TR2 may separate the first logic cell LC1 and the second logic cell LC2 from each other (FIGS. 2A and 2B). The second trench TR2 may separate the second logic cell LC2 in the second direction D2 from the first logic cell LC1.

A first trench TR1 formed on the upper portion of the substrate 100 may define a first active pattern AP1 and a second active pattern AP2 (FIGS. 2C and 2D). The first active pattern AP1 and the second active pattern AP2 may be respectively provided in the PMOS region PR and the NMOS region NR. The first trench TR1 may be shallower than the second trench TR2. The first and second active patterns AP1 and AP2 may extend in the second direction D2. The first and second active patterns AP1 and AP2 may be vertically protruding portions of the substrate 100.

According to an embodiment, the second trench TR2 may separate a single first active pattern AP1 into a pair of first active patterns AP1 that are adjacent to each other in the second direction D2 (FIG. 2A). The second trench TR2 may include a first sidewall SW1 adjacent to the first logic cell LC1 and a second sidewall SW2 adjacent to the second logic cell LC2. The first sidewall SW1 and the second sidewall SW2 may face each other in the second direction D2 across the second trench TR2. The second trench TR2 may separate a single second active pattern AP2 into a pair of second active patterns AP2 that are adjacent to each other in the second direction D2 (FIG. 2B).

A device isolation layer ST may fill the first and second trenches TR1 and TR2. The device isolation layer ST may include silicon oxide. The first and second active patterns AP1 and AP2 may have their upper portions that vertically protrude beyond the device isolation layer ST. The device isolation layer ST may not be disposed on any of the upper portions of the first and second active patterns AP1 and AP2. The device isolation layer ST may be disposed on lower sidewalls of the first and second active patterns AP1 and AP2. The device isolation layer ST may fill a lower portion of the second trench TR2 that extends in the first direction D1 between the first logic cell LC1 and the second logic cell LC2. For example, the device isolation layer ST may be directly disposed on a lower portion of each of the first and second sidewalls SW1 and SW2 included in the second trench TR2 that extends in the first direction D1.

The first active pattern AP1 may include a first channel pattern CH1 on an upper portion thereof (FIG. 2A). The second active pattern AP2 may include a second channel pattern CH2 on an upper portion thereof (FIG. 2B). Each of the first and second channel patterns CH1 and CH2 may include a first semiconductor pattern SP1, a second semiconductor pattern SP2, and a third semiconductor pattern SP3 that are sequentially stacked. The first, second, and third semiconductor patterns SP1, SP2, and SP3 may be spaced apart from each other in a vertical direction or a third direction D3.

Each of the first, second, and third semiconductor patterns SP1, SP2, and SP3 may include silicon (Si), germanium (Ge), or silicon-germanium (SiGe). For example, each of the first, second, and third semiconductor patterns SP1, SP2, and SP3 may include crystalline silicon.

A plurality of first recesses RS1 may be formed on the upper portion of the first active pattern AP1 (FIG. 2A). First source/drain patterns SD1 may be provided in corresponding first recesses RS1. The first source/drain patterns SD1 may be impurity regions having a first conductivity type (e.g., p-type). The first channel pattern CH1 may be interposed between a pair of first source/drain patterns SD1. For example, the pair of first source/drain patterns SD1 may be connected to each other through the stacked first, second, and third semiconductor patterns SP1, SP2, and SP3.

A plurality of second recesses RS2 may be formed on the upper portion of the second active pattern AP2 (FIG. 2B). Second source/drain patterns SD2 may be provided in corresponding second recesses RS2. The second source/drain patterns SD2 may be impurity regions having a second conductivity type (e.g., n-type). The second channel pattern CH2 may be interposed between a pair of second source/drain patterns SD2. For example, the pair of second source/drain patterns SD2 may be connected to each other through the stacked first, second, and third semiconductor patterns SP1, SP2, and SP3.

The first and second source/drain patterns SD1 and SD2 may be epitaxial patterns formed by a selective epitaxial growth process. For example, each of the first and second source/drain patterns SD1 and SD2 may have a top surface disposed at a level substantially the same as that of a top surface of the third semiconductor pattern SP3. As another example, each of the first and second source/drain patterns SD1 and SD2 may have a top surface disposed at a higher level than that of a top surface of the third semiconductor pattern SP3.

The first source/drain patterns SD1 may include a semiconductor element (e.g., SiGe) whose lattice constant is greater than that of a semiconductor element of the substrate 100. Therefore, a pair of first source/drain patterns SD1 may provide the first channel pattern CH1 with compressive stress. The second source/drain patterns SD2 may include the same semiconductor element (e.g., Si) as that of the substrate 100.

Dummy gate electrodes DGE may be provided adjacent to the first sidewall SW1 and the second sidewall SW2 of the second trench TR2 (FIGS. 2A and 2B). The dummy gate electrode DGE may run across the first active pattern AP1 and the second active pattern AP2, while extending in the first direction D1. The dummy gate electrode DGE may be disposed adjacent to the isolation region IR. The dummy gate electrode DGE may not be connected to a gate contact GC which will be discussed below.

The dummy gate electrode DGE may include a body part UP, a vertical part VP that vertically and downwardly extends from the body part UP along the first sidewall SW1 or the second sidewall SW2 of the second trench TR2, and one or more protruding parts PT that protrude from the vertical part VP toward the first source/drain pattern SD1 or the second source/drain pattern SD2.

A width in the second direction D2 of the body part UP may be greater than a width in the second direction D2 of the vertical part VP. The protruding parts PT of the dummy gate electrode DGE near the PMOS region PR may be adjacent to the first source/drain pattern SD1. The protruding parts PT of the dummy gate electrode DGE near the NMOS region NR may be adjacent to an inner spacer IP which will be discussed below.

Dummy gate spacers DGS may be provided on opposite sidewalls of the dummy gate electrode DGE. The dummy gate spacer DGS may include the same material as that of a gate spacer GS which will be discussed below. One of the dummy gate spacers DGS on the dummy gate electrode DGE may vertically extend along one of the first and second sidewalls SW1 and SW2 of the second trench TR2 to contact a top surface of the device isolation layer ST.

A dummy gate dielectric layer DGI may be interposed between the dummy gate electrode DGE and the first channel pattern CH1 and between the dummy gate electrode DGE and the second channel pattern CH2. The dummy gate dielectric layer DGI may include the same material as that of a gate dielectric layer GI which will be discussed below.

Gate electrodes GE may be provided to extend in the first direction D1, while running across the first and second active patterns AP1 and AP2. Each of the gate electrodes GE may vertically overlap the first and second channel patterns CH1 and CH2. The gate electrodes GE may be spaced apart in the second direction D2 from the dummy gate electrode DGE.

The gate electrode GE may include a first part PO1 interposed between the substrate 100 and the first semiconductor pattern SP1, a second part PO2 interposed between the first semiconductor pattern SP1 and the second semiconductor pattern SP2, a third part PO3 interposed between the second semiconductor pattern SP2 and the third semiconductor pattern SP3, and a fourth part PO4 on the third semiconductor pattern SP3.

Referring back to FIG. 2A, on the PMOS region PR, the gate electrode GE may have different widths at the first, second, and third parts PO1, PO2, and PO3 thereof. For example, a maximum width in the second direction D2 of the third part PO3 may be greater than a maximum width in the second direction D2 of the second part PO2. A maximum width in the second direction D2 of the first part PO1 may be greater than the maximum width in the second direction D2 of the third part PO3.

Referring back to FIG. 2D, the gate electrode GE may be provided on a top surface TS, a bottom surface BS, and opposite sidewalls SIW of each of the first, second, and third semiconductor patterns SP1, SP2, and SP3. For example, a transistor according to the present embodiment may be a three-dimensional field-effect transistor (e.g., multi-bridge channel field effect transistor (MBCFET) or a gate all around field effect transistor (GAAFET)) in which a gate electrode three-dimensionally surrounds a channel.

Referring back to FIGS. 1 and 2A to 2D, a pair of gate spacers GS may be disposed on opposite sidewalls of the fourth part PO4 of the gate electrode GE. The gate spacers GS may extend in the first direction D1 along the gate electrode GE. The gate spacers GS may have their top surfaces higher than that of the gate electrode GE. The top surfaces of the gate spacers GS may be at a same level as that of a first interlayer dielectric layer 110 which will be discussed below. The gate spacers GS may include at least one selected from SiCN, SiCON, and SiN. Alternatively, the gate spacers GS may each include a multiple layer formed of at least two selected from SiCN, SiCON, and SiN.

A gate capping pattern GP may be provided on each of the gate electrode GE and the dummy gate electrode DGE. The gate capping pattern GP may extend in the first direction D1 along the gate electrode GE or the dummy gate electrode DGE. The gate capping pattern GP may include a material having an etch selectivity with respect to first and second interlayer dielectric layers 110 and 120 which will be discussed below. For example, the gate capping pattern GP may include at least one selected from SiON, SiCN, SiCON, and SiN.

A gate dielectric layer GI may be interposed between the gate electrode GE and the first channel pattern CH1 and between the gate electrode GE and the second channel pattern CH2. The gate dielectric layer GI may be disposed on the top surface TS, the bottom surface BS, and the opposite sidewalls SIW of each of the first, second, and third semiconductor patterns SP1, SP2, and SP3. The gate dielectric layer GI may be disposed on the top surface of the device isolation layer ST below the gate electrode GE (see FIG. 2D).

According to embodiments, each of the gate dielectric layer GI and the dummy gate dielectric layer DGI may include one or more of a silicon oxide layer, a silicon oxynitride layer, and a high-k dielectric layer. The high-k dielectric layer may include a high-k dielectric material whose dielectric constant is greater than that of a silicon oxide layer. For example, the high-k dielectric material may include at least one selected from hafnium oxide, hafnium silicon oxide, hafnium zirconium oxide, hafnium tantalum oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, and lead zinc niobate.

Alternatively, a semiconductor device according to embodiments may include a negative capacitance field-effect transistor that uses a negative capacitor. For example, each of the gate dielectric layer GI and the dummy gate dielectric layer DGI may include a ferroelectric material layer that exhibits ferroelectric properties and a paraelectric material layer that exhibits paraelectric properties.

The ferroelectric material layer may have a negative capacitance. The paraelectric material layer may have a positive capacitance. For example, when two or more capacitors are connected in series, and when each capacitor has a positive capacitance, an overall capacitance may be reduced to be smaller than the capacitance of each capacitor. In contrast, when at least one of two or more capacitors connected in series has a negative capacitance, an overall capacitance may have a positive value that is increased to be greater than an absolute value of the capacitance of each capacitor.

When the ferroelectric material layer having a negative capacitance is connected in series to the paraelectric material layer having a positive capacitance, there may be an increase in overall capacitance of the ferroelectric and paraelectric material layers that are connected in series. The increase in overall capacitance may be used to allow a transistor including the ferroelectric material layer to have a sub-threshold swing of smaller than about 60 mV/decade at room temperature.

The ferroelectric material layer may have ferroelectric properties. The ferroelectric material layer may include, for example, one or more of hafnium oxide, hafnium zirconium oxide, barium strontium titanium oxide, and lead zirconium titanium oxide. For example, the hafnium zirconium oxide may be a material in which hafnium oxide is doped with zirconium (Zr). For another example, the hafnium zirconium oxide may be a compound of hafnium (Hf), zirconium (Zr), and oxygen (O).

The ferroelectric material layer may further include impurities doped therein. For example, the impurities may include one or more of aluminum (Al), titanium (Ti), niobium (Nb), lanthanum (La), yttrium (Y), magnesium (Mg), silicon (Si), calcium (Ca), cerium (Ce), dysprosium (Dy), erbium (Er), gadolinium (Gd), germanium (Ge), scandium (Sc), strontium (Sr), and tin (Sn). The type of impurities included in the ferroelectric material layer may be changed depending on what ferroelectric material is included in the ferroelectric material layer.

When the ferroelectric material layer includes hafnium oxide, the ferroelectric material layer may include at least one of impurities such as gadolinium (Gd), silicon (Si), zirconium (Zr), aluminum (Al), and yttrium (Y).

When the impurities are aluminum (Al), the ferroelectric material layer may include about 3 to 8 atomic percent aluminum. In this description, the ratio of impurities may be a ratio of aluminum to the sum of hafnium and aluminum.

When the impurities are silicon (Si), the ferroelectric material layer may include about 2 to about 10 atomic percent silicon. When the impurities are yttrium (Y), the ferroelectric material layer may include about 2 to about 10 atomic percent yttrium. When the impurities are gadolinium (Gd), the ferroelectric material layer may include about 1 to about 7 atomic percent gadolinium. When the impurities are zirconium (Zr), the ferroelectric material layer may include about 50 to about 80 atomic percent zirconium.

The paraelectric material layer may have paraelectric properties. The paraelectric material layer may include, for example, at least one selected from silicon oxide and high-k metal oxide. The metal oxide included in the paraelectric material layer may include, for example, at least one selected from hafnium oxide, zirconium oxide, and aluminum oxide, but the disclosure is not limited thereto.

The ferroelectric and paraelectric material layers may include the same material. The ferroelectric material layer may have ferroelectric properties, but the paraelectric material layer may not have ferroelectric properties. For example, when the ferroelectric material layer and the paraelectric material layer include hafnium oxide, the hafnium oxide included in the ferroelectric material layer may have a crystal structure different from that of the hafnium oxide included in the paraelectric material layer.

The ferroelectric material layer may have a thickness having ferroelectric properties. The thickness of the ferroelectric material layer may range, for example, from about 0.5 nm to about 10 nm, but the disclosure is not limited thereto. Because ferroelectric materials have their own critical thickness that exhibits ferroelectric properties, the thickness of the ferroelectric material layer may depend on ferroelectric material.

For example, each of the gate dielectric layer GI and the dummy gate dielectric layer DGI may include a single ferroelectric material layer. For another example, each of the gate dielectric layer GI and the dummy gate dielectric layer DGI may include a plurality of ferroelectric material layers that are spaced apart from each other. Each of the gate dielectric layer GI and the dummy gate dielectric layer DGI may have a stacked structure in which a plurality of ferroelectric material layers are alternately stacked with a plurality of paraelectric material layers.

The gate electrode GE may include a first metal pattern and a second metal pattern on the first metal pattern. The first metal pattern may be provided on the gate dielectric layer GI and may be adjacent to the first, second, and third semiconductor patterns SP1, SP2, and SP3. The first metal pattern may include a work-function metal that controls a threshold voltage of a transistor. A thickness and composition of the first metal pattern may be adjusted to achieve a desired threshold voltage of a transistor. For example, the first, second, and third parts PO1, PO2, and PO3 of the gate electrode GE may be formed of the first metal pattern or a work-function metal. The dummy gate electrode DGE may have a structure substantially the same as or similar to that of the gate electrode GE.

The first metal pattern may include a metal nitride layer. For example, the first metal pattern may include nitrogen (N) and at least one metal selected from titanium (Ti), tantalum (Ta), aluminum (Al), tungsten (W), and molybdenum (Mo). In addition, the first metal pattern may further include carbon (C). The first metal pattern may include a plurality of stacked work-function metal layers.

The second metal pattern may include metal whose resistance is smaller than that of the first metal pattern. For example, the second metal pattern may include at least one metal selected from tungsten (W), aluminum (Al), titanium (Ti), and tantalum (Ta). For example, the fourth part PO4 of the gate electrode GE may include a first metal pattern and a second metal pattern on the first metal pattern.

Referring back to FIG. 2B, inner spacers IP may be provided in the NMOS region NR. The inner spacers IP may be correspondingly interposed between the second source/drain pattern SD2 and the first, second, and third parts PO1, PO2, and PO3 of the gate electrode GE. The inner spacers IP may be in direct contact with the second source/drain pattern SD2. The inner spacer IP may separate the second source/drain pattern SD2 from each of the first, second, third parts PO1, PO2, and PO3 of the gate electrode GE.

The inner spacer IP may include a low-k dielectric material. The low-k dielectric material may include a material whose dielectric constant is smaller than that of silicon oxide or silicon nitride. For example, the low-k dielectric material may include at least one selected from silicon oxide, silicon oxide doped with fluorine or carbon, porous silicon oxide, and organic polymeric dielectrics.

A first interlayer dielectric layer 110 may be provided on the substrate 100. The first interlayer dielectric layer 110 may be disposed on the gate spacers GS, the dummy gate spacers DGS, and the first and second source/drain patterns SD1 and SD2. The first interlayer dielectric layer 110 may have a top surface substantially at a same level as that of the gate capping pattern GP, that of the dummy gate spacer DGS, and that of the gate spacer GS. The first interlayer dielectric layer 110 may be provided thereon with a second interlayer dielectric layer 120 that is disposed on the gate capping pattern GP. According to an embodiment, the first and second interlayer dielectric layers 110 and 120 may include a silicon oxide layer.

A separation pattern DB may extend in the first direction D1 between the dummy gate electrode DGE and the gate electrode GE. The separation pattern DB may be interposed between a pair of first source/drain patterns SD1 adjacent to the isolation region IR and between a pair of second source/drain patterns SD2 adjacent to the isolation region IR. The separation pattern DB may have a bottom surface lower than a bottom end of the first source/drain pattern SD1 and a bottom end of the second source/drain pattern SD2. The separation pattern DB may run across the first active pattern AP1 and the second active pattern AP2. The separation pattern DB may be adjacent to the inner spacer IP in the NMOS region NR.

A gate spacer GS may be provided on an upper sidewall of the separation pattern DB. The bottom surface of the separation pattern DB may be disposed at a higher level than that of a bottom surface of the device isolation layer ST. Alternatively, the bottom surface of the separation pattern DB may be disposed at a level substantially the same as or lower than that of a bottom surface of the device isolation layer ST. The separation pattern DB may have a top surface at a same level as that of the gate capping pattern GP, that of the gate spacer GS, and that of the dummy gate spacer DGS.

The separation pattern DB may include a different material from that of the device isolation layer ST. For example, the separation pattern DB may include silicon nitride.

Active contacts AC may be provided to penetrate the first and second interlayer dielectric layers 110 and 120, and have electrical connection with the first and second source/drain patterns SD1 and SD2. A pair of active contacts AC may be provided on opposite sides of the gate electrode GE. When viewed in plan, the active contact AC may have a bar shape that extends in the first direction D1. The active contact AC may be a self-aligned contact. For example, the gate capping pattern GP and the gate spacer GS may be used to form the active contact AC in a self-alignment manner. The active contact AC may be disposed on, for example, at least a portion of a sidewall of the gate spacer GS. Although not shown, the active contact AC may be disposed on a portion of the top surface of the gate capping pattern GP. The active contact AC may not be provided on any of the first source/drain pattern SD1 and the second source/drain pattern SD2 that are adjacent to the second trench TR2.

Silicide patterns SC may be correspondingly interposed between the active contact AC and the first source/drain pattern SD1 and between the active contact AC and the second source/drain pattern SD2. The active contact AC may be electrically connected through the silicide pattern SC to one of the first and second source/drain patterns SD1 and SD2. The silicide pattern SC may include metal silicide, for example, at least one selected from titanium silicide, tantalum silicide, tungsten silicide, nickel silicide, and cobalt silicide.

A gate contact GC may be provided to penetrate the second interlayer dielectric layer 120 and the gate capping pattern GP, and have electrical connection with the gate electrode GE. According to an embodiment, referring to FIG. 2B, an upper dielectric pattern UIP may form an upper portion of each of the active contacts AC, which is adjacent to the gate contact GC. Therefore, it may be possible to prevent process failure such as an electrical short caused by contact between the gate contact GC and its adjacent active contact AC.

Each of the active contact AC and the gate contact GC may include a conductive pattern FM and a barrier pattern BM that surrounds the conductive pattern FM. For example, the conductive pattern FM may include at least one metal selected from aluminum, copper, tungsten, molybdenum, and cobalt. The barrier pattern BM may be disposed on sidewalls and a bottom surface of the conductive pattern FM. The barrier pattern BM may include a metal layer and a metal nitride layer. The metal layer may include at least one selected from titanium, tantalum, tungsten, nickel, cobalt, and platinum. The metal nitride layer may include at least one selected from a titanium nitride (TiN) layer, a tantalum nitride (TaN) layer, a tungsten nitride (WN) layer, a nickel nitride (NiN) layer, a cobalt nitride (CoN) layer, and a platinum nitride (PtN) layer.

A first metal layer M1 may be provided in a third interlayer dielectric layer 130. The first metal layer M1 may include first line M1_I and first vias VI1. Each of the first lines M1_I may have a linear or bar shape that extends in the second direction D2. The first vias VI1 may be provided below the first lines M1_I. The first vias VI1 may be correspondingly interposed between the active contacts AC and the first lines M1_I. The first vias VI1 may be correspondingly interposed between the gate contacts GC and the first lines M1_I.

The first line M1_I and its underlying first vias VI1 of the first metal layer M1 may be formed by individual processes. For example, the first lines M1_I and the first vias VI1 may each be formed by a single damascene process. A sub-20 nm process may be employed to manufacturing a semiconductor device according to the present embodiment.

A second metal layer M2 may be provided in a fourth interlayer dielectric layer 140. The second metal layer M2 may include second lines M2_I. Each of the second lines M2_I may have a linear or bar shape that extends in the first direction D1.

The second metal layer M2 may further include second vias VI2. The second vias VI2 may be provided below the second lines M2_I. The second vias VI2 may be correspondingly interposed between the first lines M1_I and the second lines M2_I.

The second line M2_I and its underlying second via VI2 of the second metal layer M2 may be formed into a single piece in the same process. For example, a dual damascene process may be employed to simultaneously form the second line M2_I and the second via VI2 of the second metal layer M2.

The first lines M1_I of the first metal layer M1 and the second lines M2_I of the second metal layer M2 may include the same or different conductive materials. For example, the first lines M1_I and the second lines M2_I may include at least one metallic material selected from aluminum, copper, tungsten, molybdenum, and cobalt.

According to embodiments, although not shown, stacked metal layers (e.g., M3, M4, M5, etc.) may be additionally provided on the fourth interlayer dielectric layer 140. Each of the stacked metal layers may include routing lines.

Figure 3:
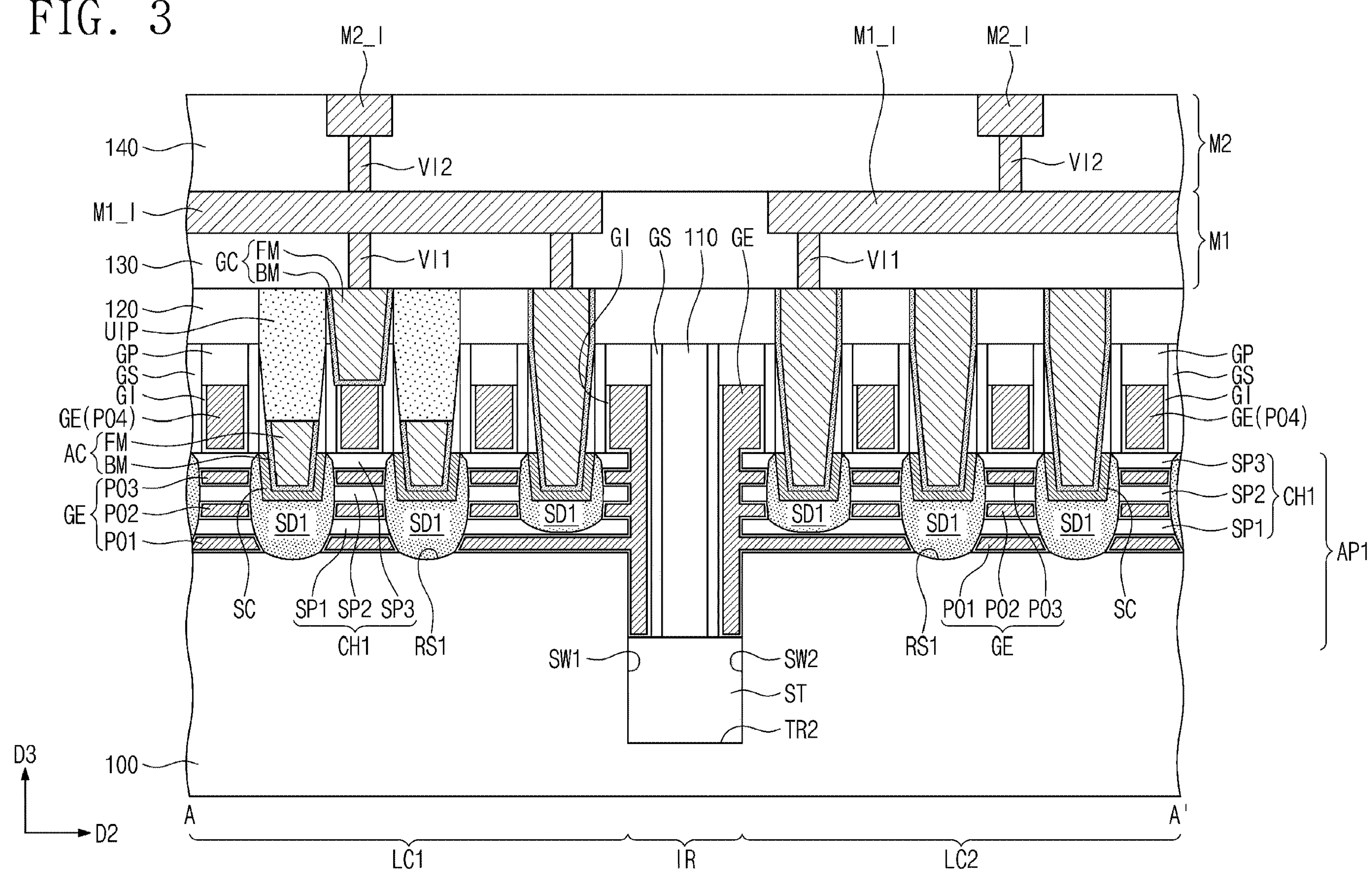
FIG. 3 illustrates a cross-sectional view taken along line A-A' of FIG. 1, showing a semiconductor device according to a comparative embodiment.

FIG. 3 illustrates a cross-sectional view taken along line A-A' of FIG. 1, showing a semiconductor device according to a comparative embodiment.

Referring to FIGS. 1 and 3, the first source/drain pattern SD1 adjacent to the second trench TR2 may have a thickness smaller than those of other first source/drain patterns SD1. In MBCFET structures, reduction in size of semiconductor devices may increase an aspect ratio of a sacrificial pattern PP which will be discussed below, and this trend may cause a tilting of the sacrificial pattern PP adjacent to the second trench TR2 (see FIGS. 8, 9A, and 9B). As the tilting of the sacrificial pattern PP adjacent to the second trench TR2 may reduce an exposed area of the first active pattern AP1 when the first recess RS1 is formed, it may be impossible to achieve a desired depth of the first recess RS1. Therefore, neighboring gate electrodes GE may be connected to each other without being separated from each other, and this connection may induce malfunction and failure of semiconductor devices. As a result, semiconductor devices may be degraded in reliability and electrical properties.

According to embodiments, the separation pattern DB may be provided between the gate electrode GE and the dummy gate electrode DGE formed adjacent to the second trench TR2. Therefore, even when neighboring gate electrodes GE are connected to each other because the first recess RS1 is formed to have an insufficient thickness as discussed above, semiconductor devices may be prevented from malfunction and failure. Thus, semiconductor devices may not be degraded in electrical properties.

Figure 11A:
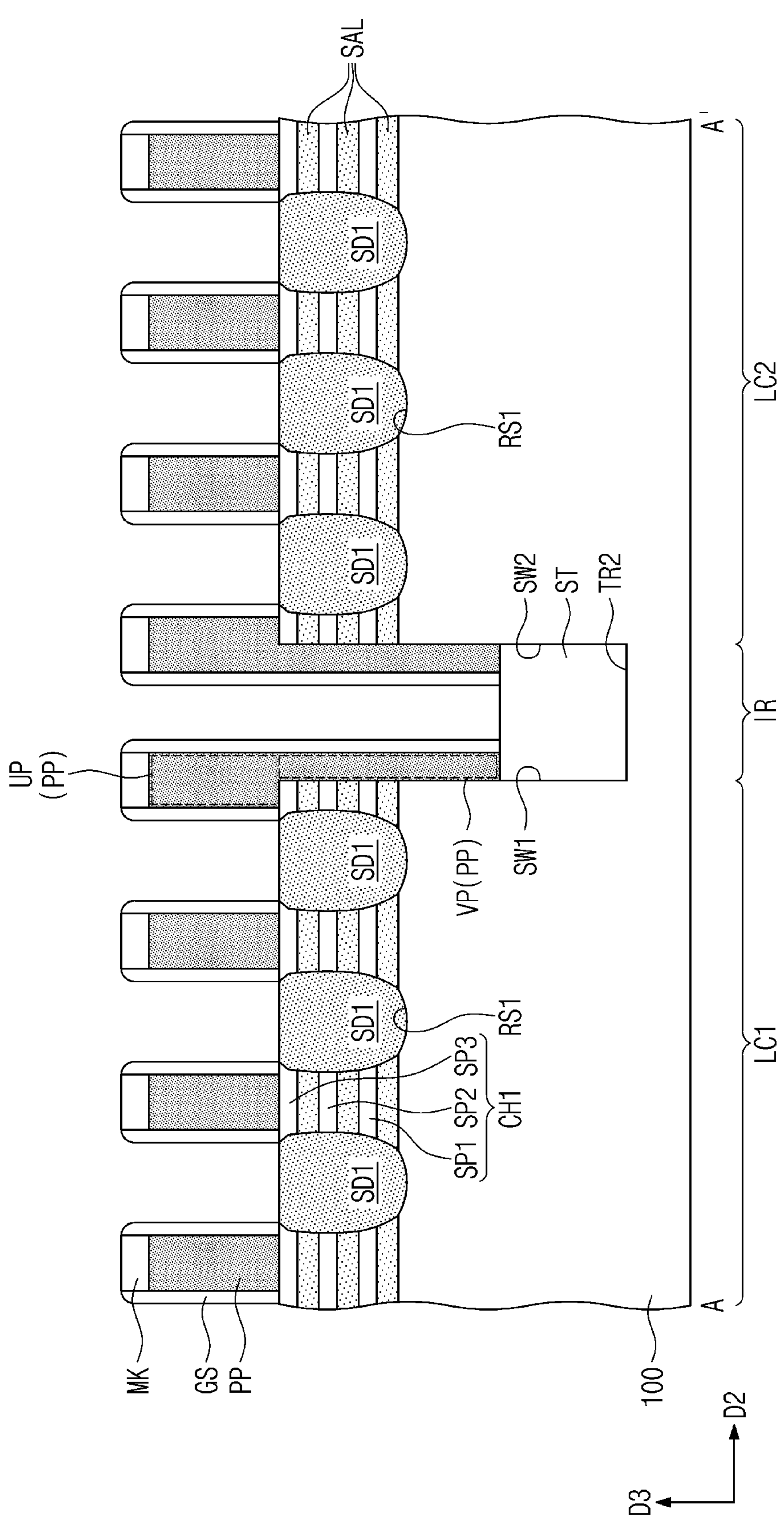
Figure 11B:
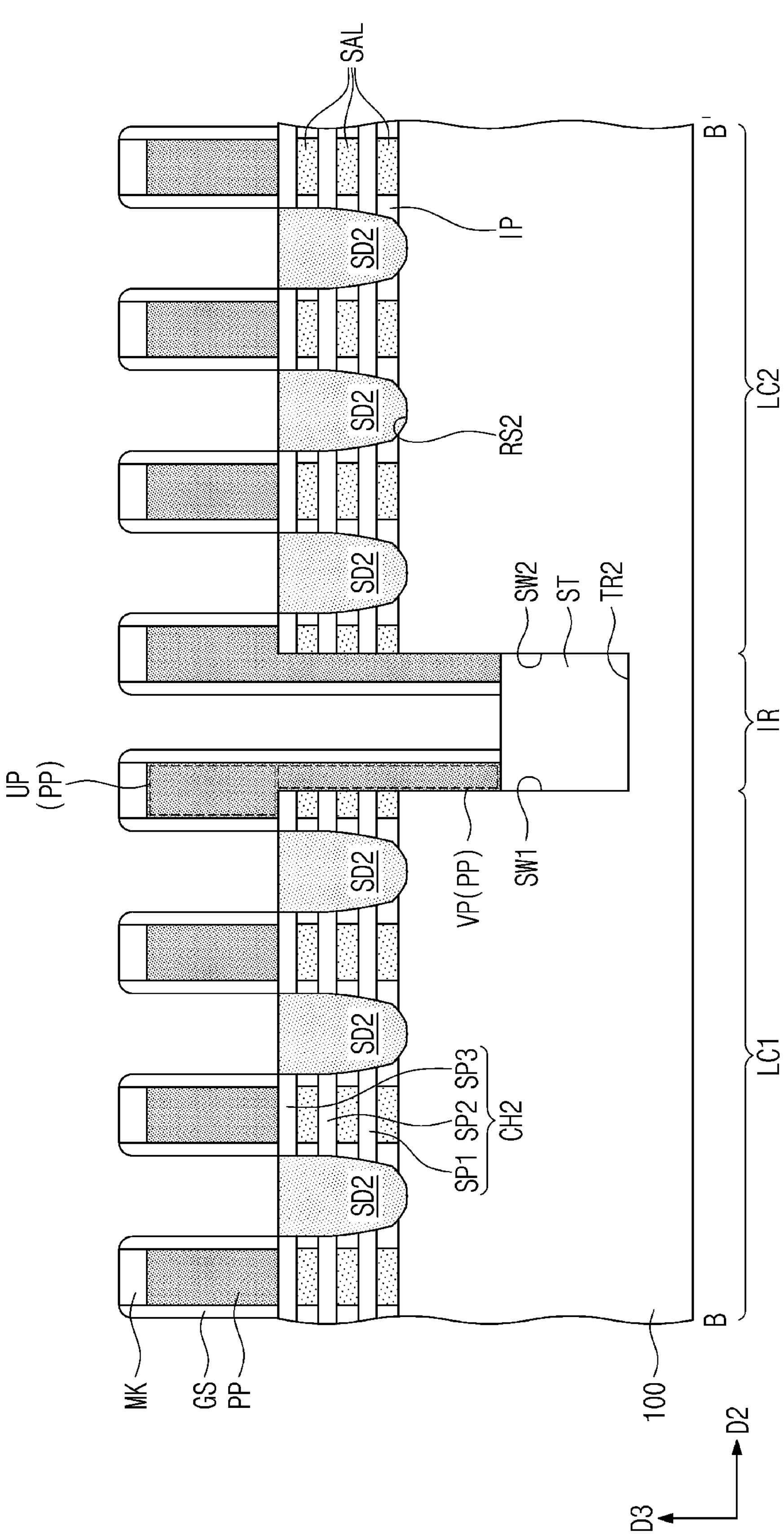
Figure 11C:
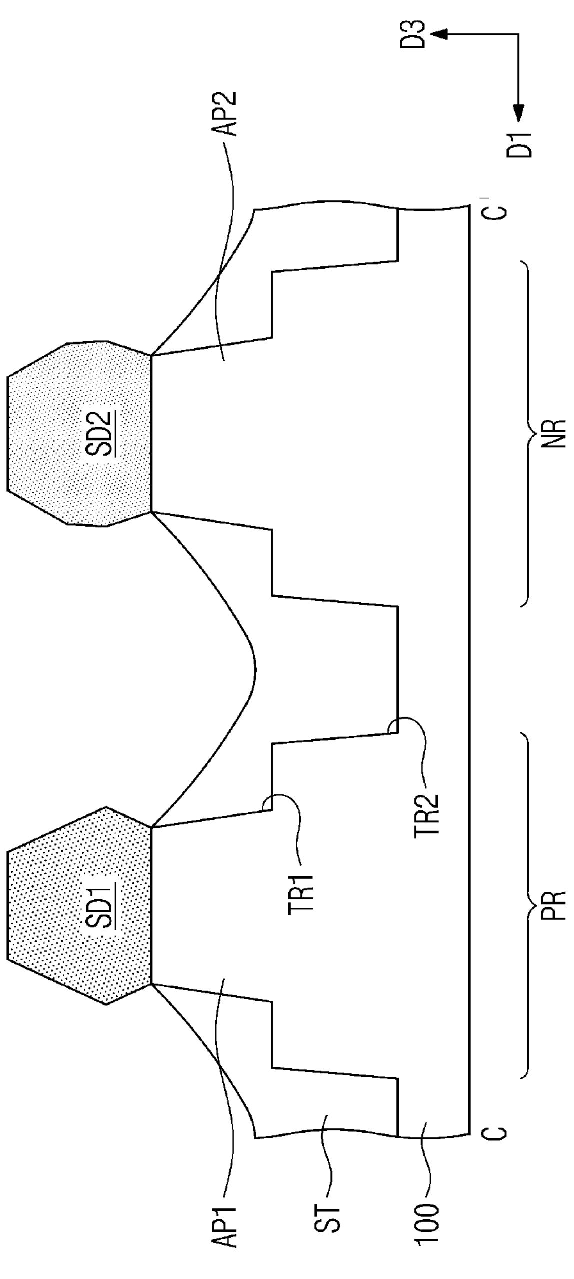
FIGS. 11C, 13C, and 15C illustrate cross-sectional views taken along line C-C' of FIGS. 10, 12, and 14, respectively.
Figure 11D:
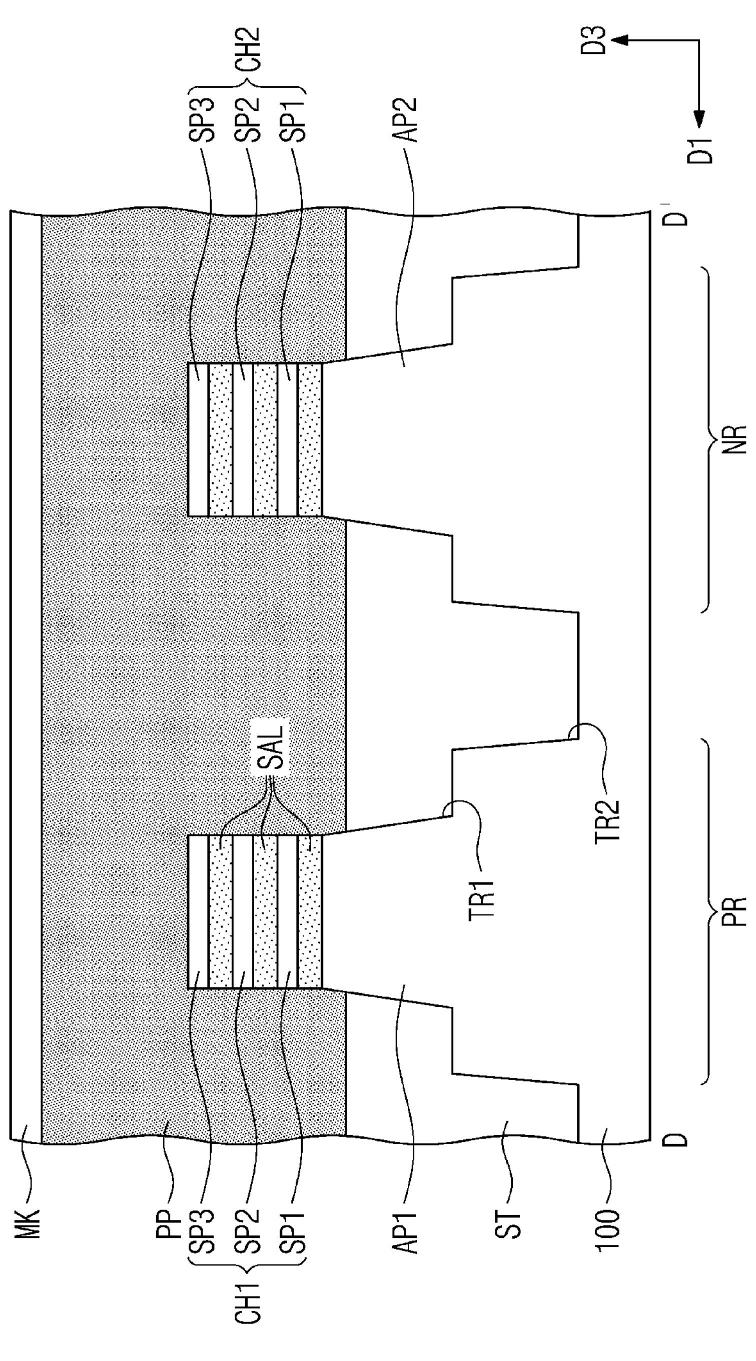
FIGS. 11D and 13D illustrate cross-sectional views taken along line D-D' of FIGS. 10 and 12, respectively.
Figure 12:
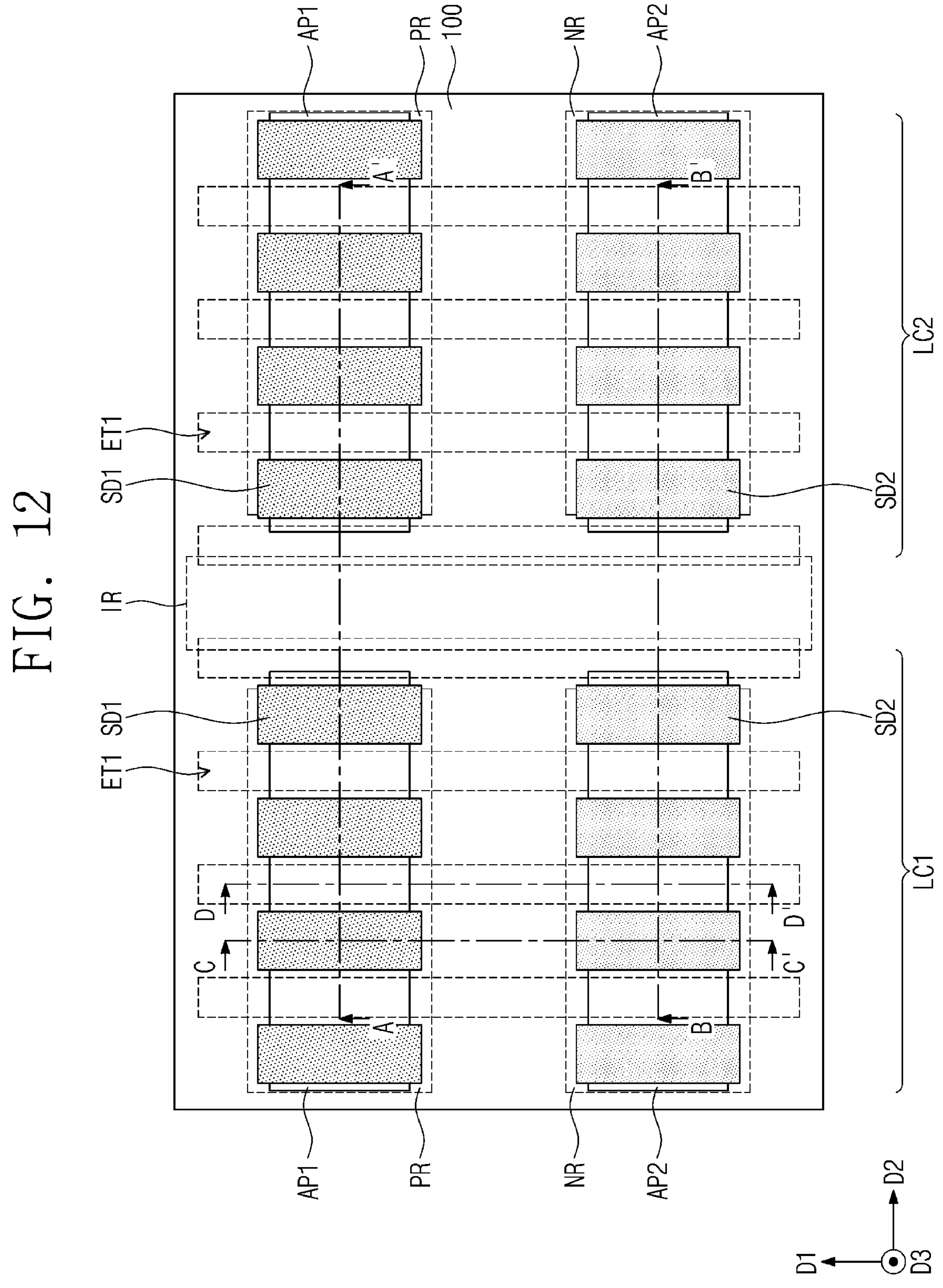
Figure 13A:
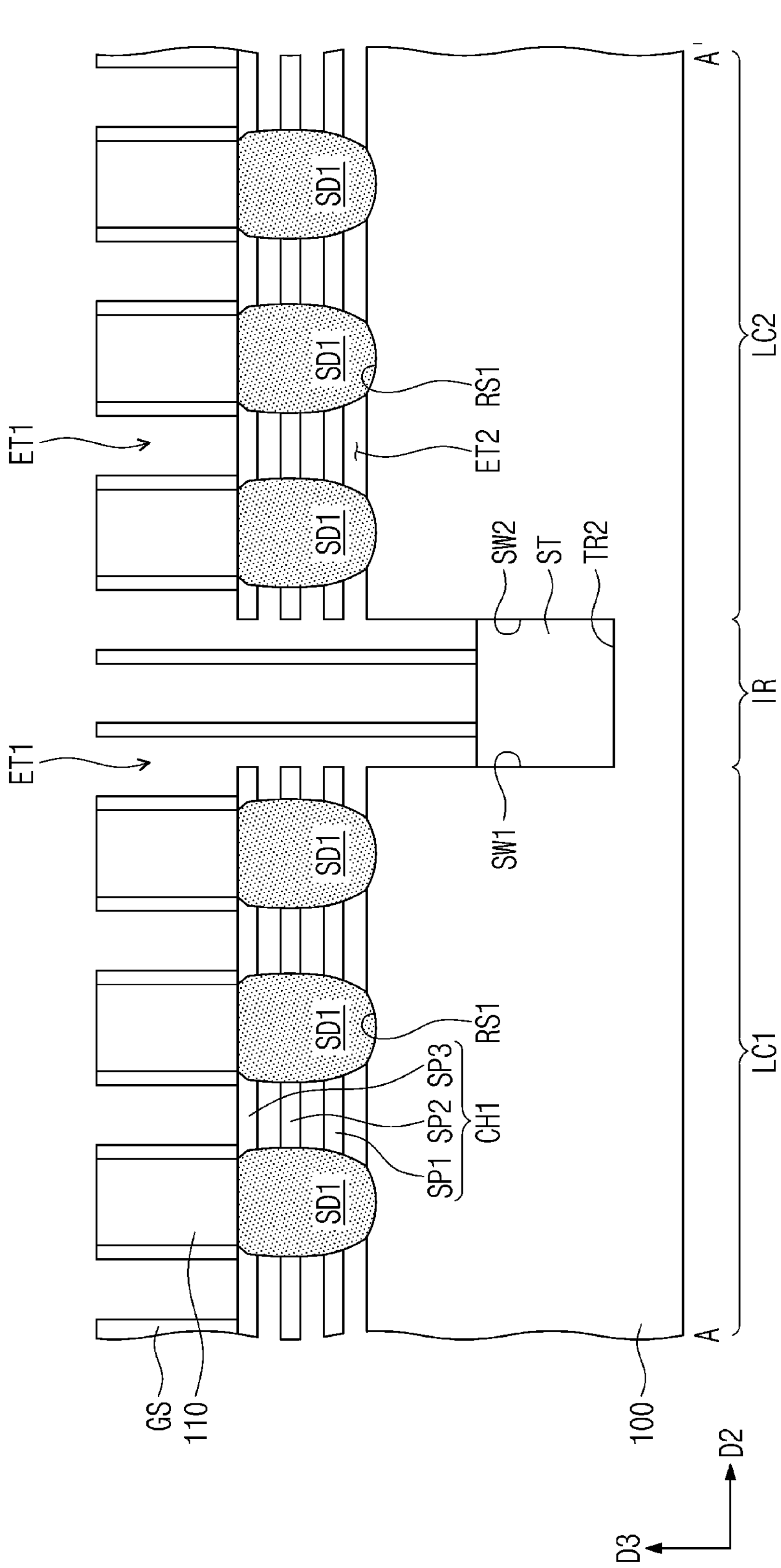
Figure 13B:
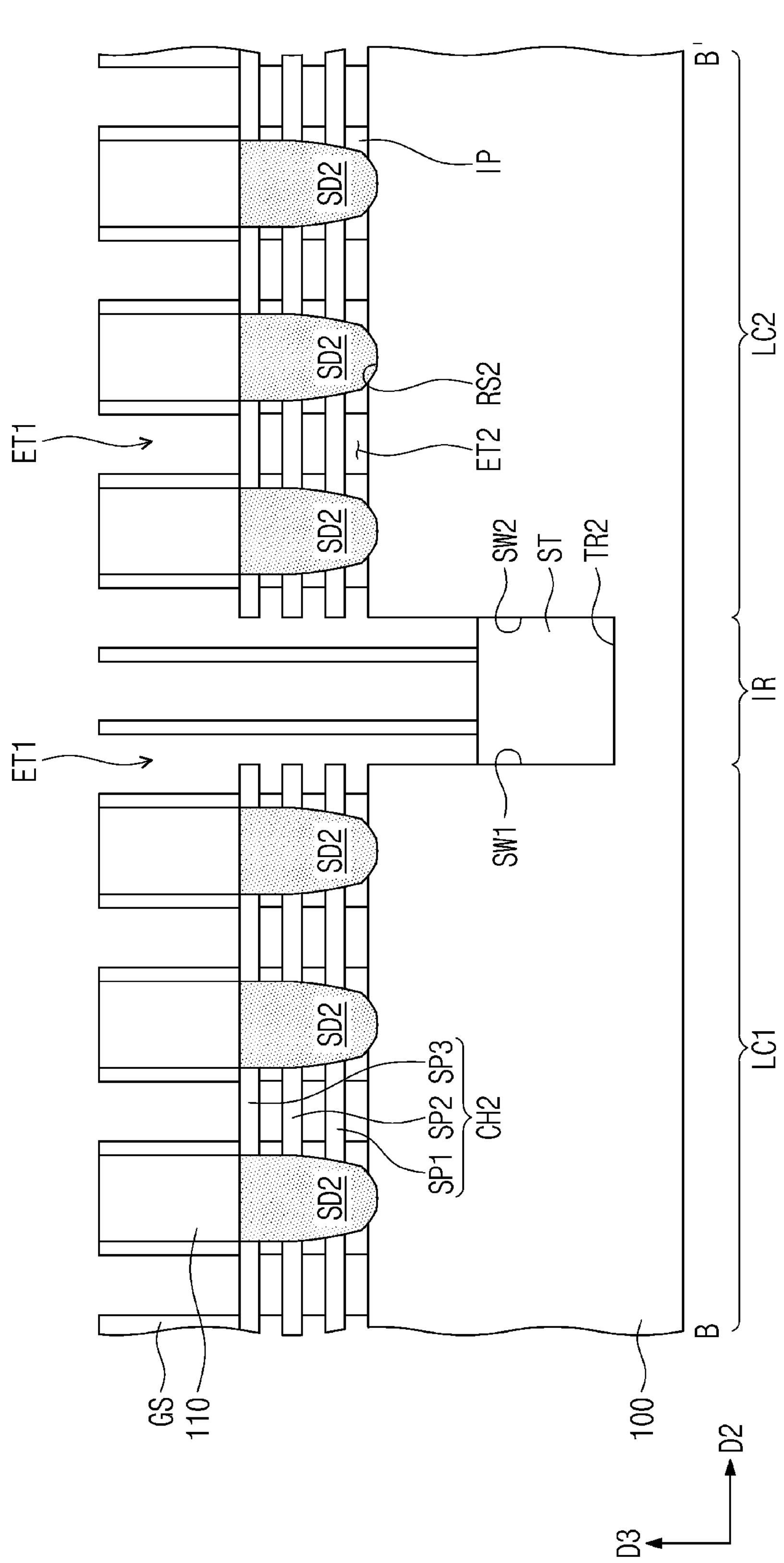
Figure 13C:
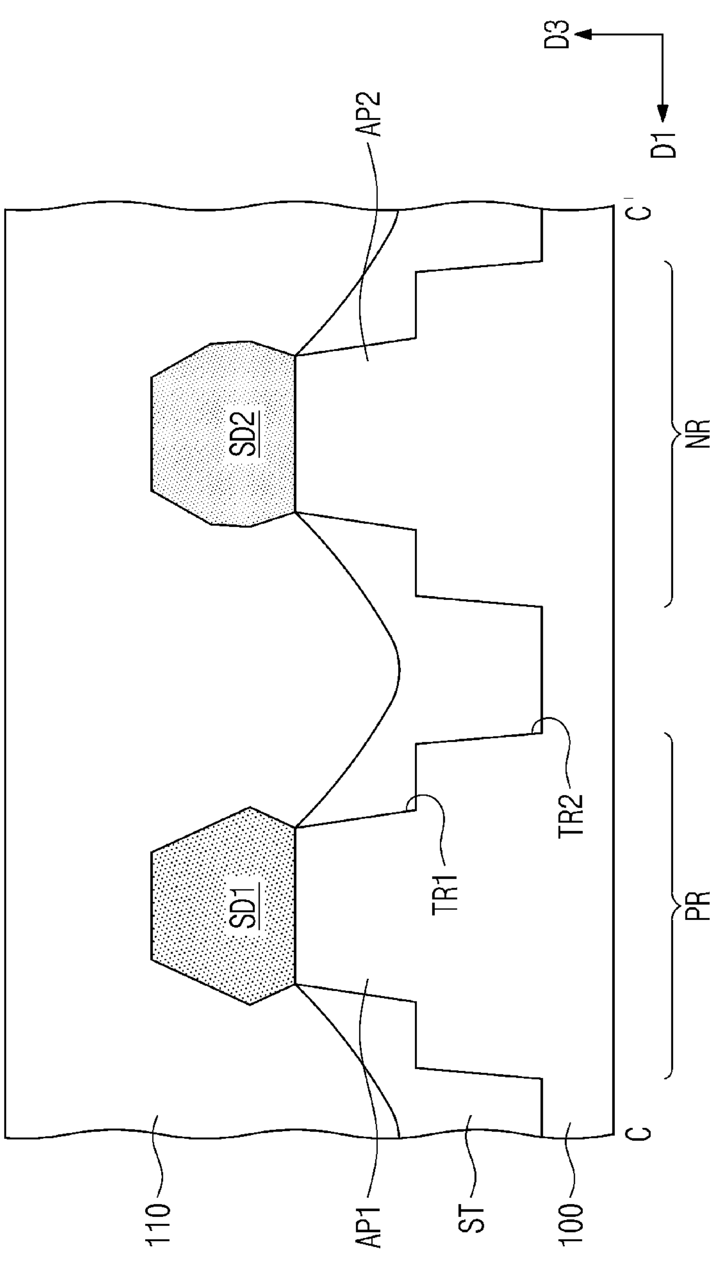
Figure 13D:
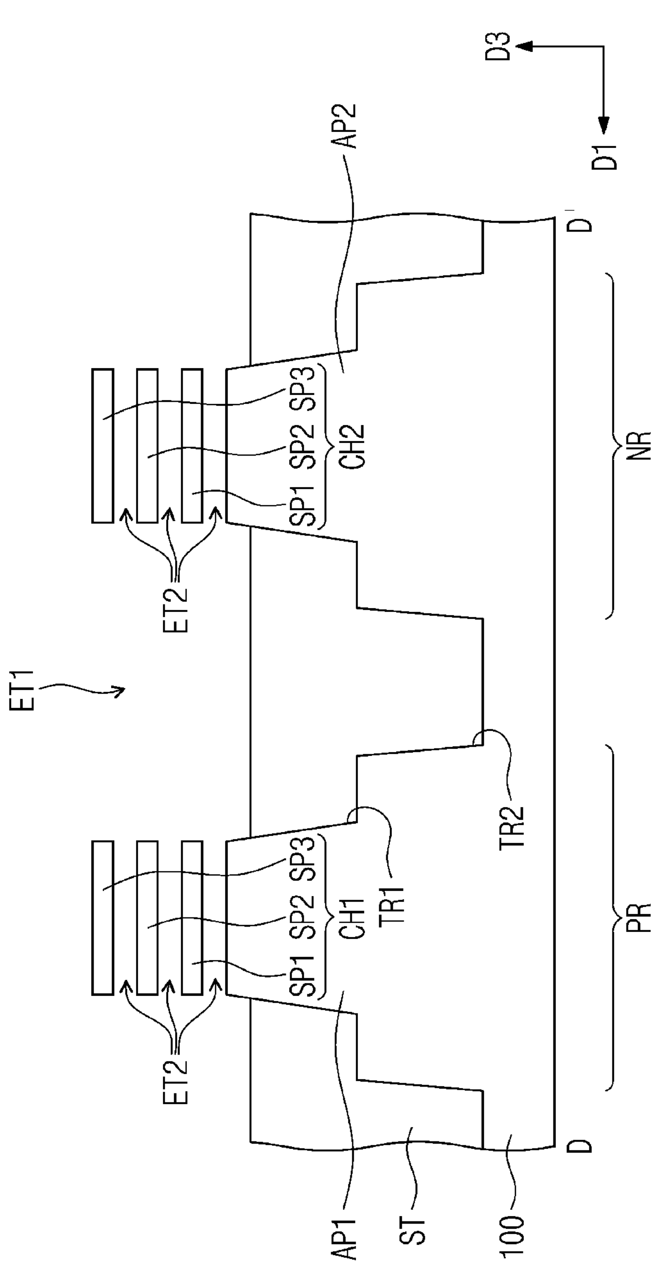
Figure 14:
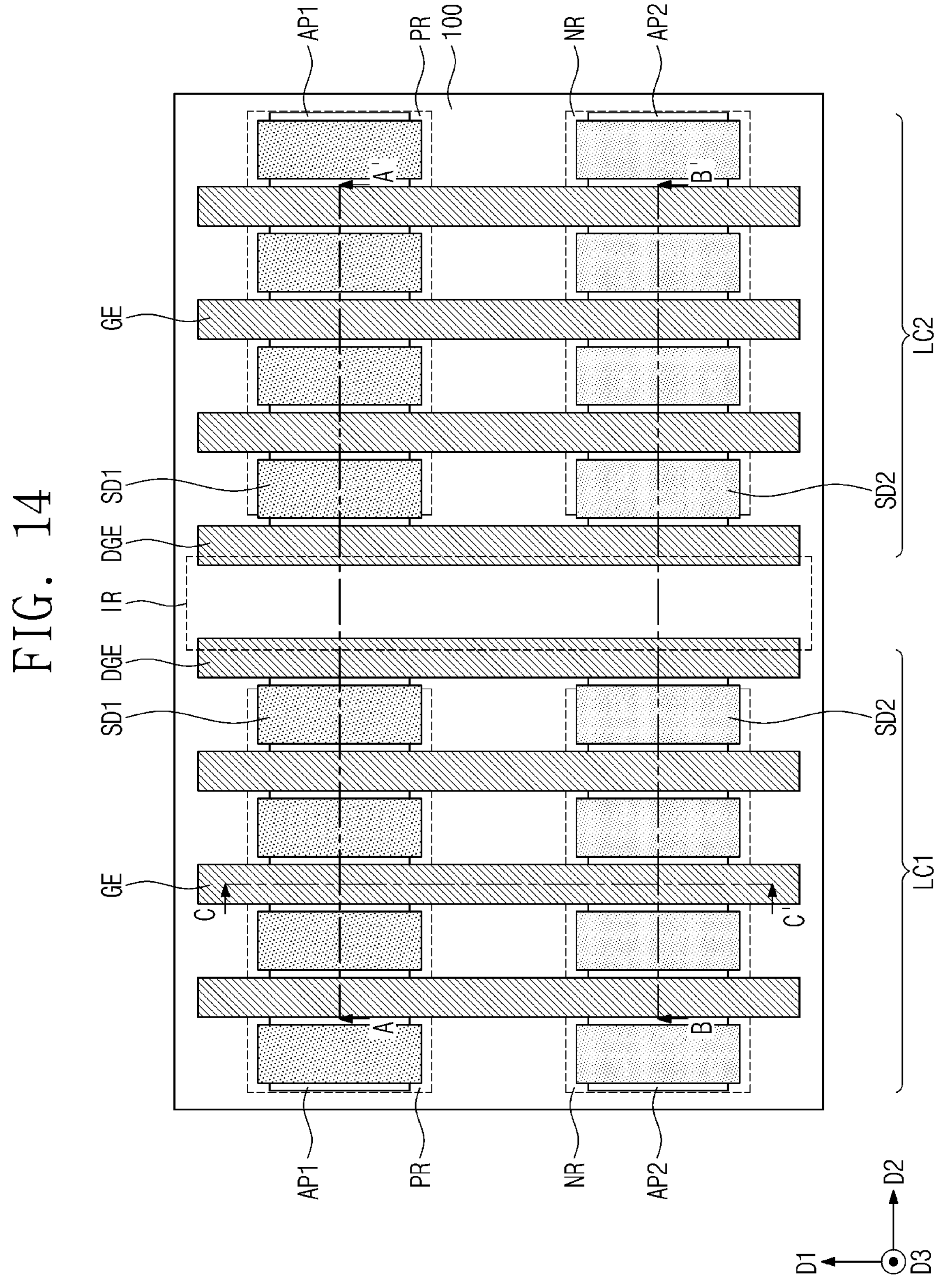
Figure 15A:
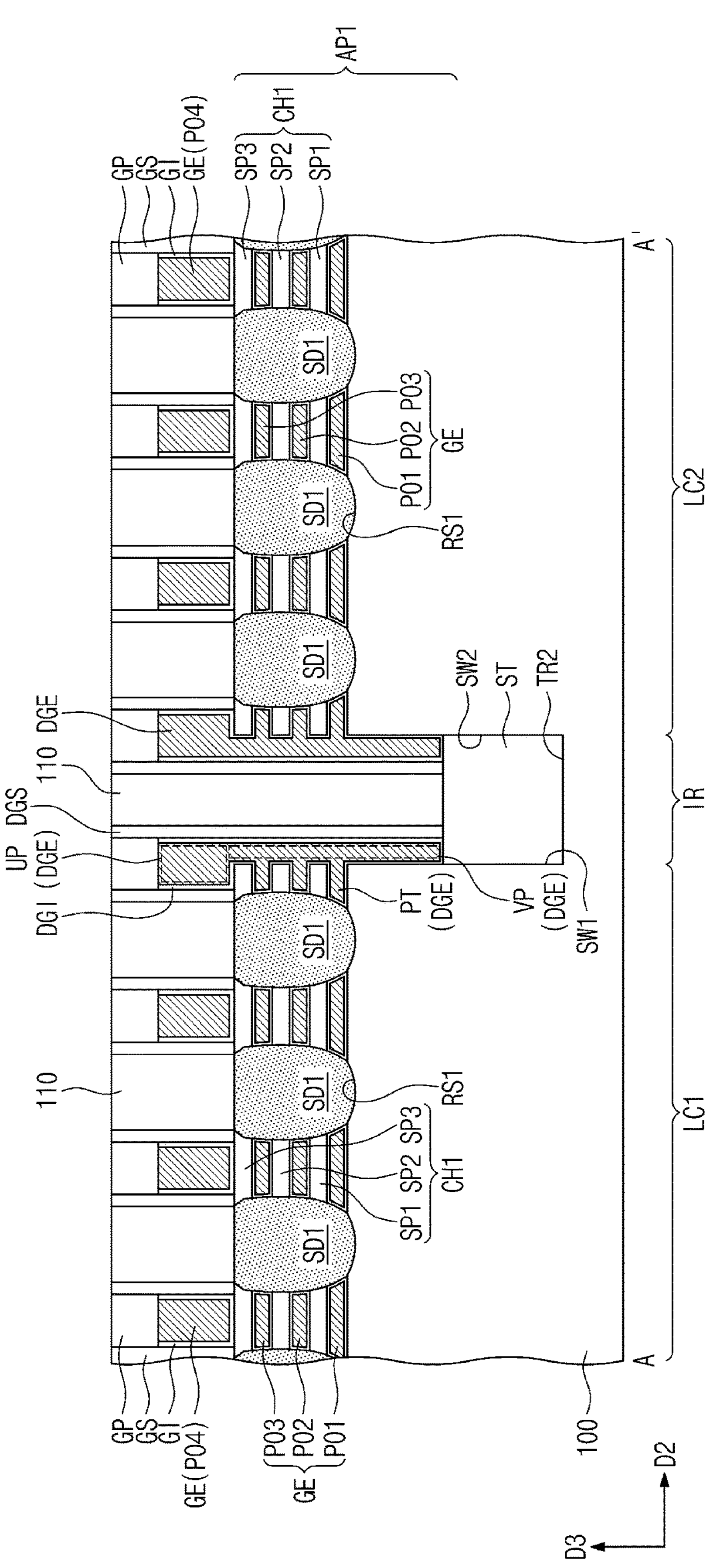
Figure 15B:
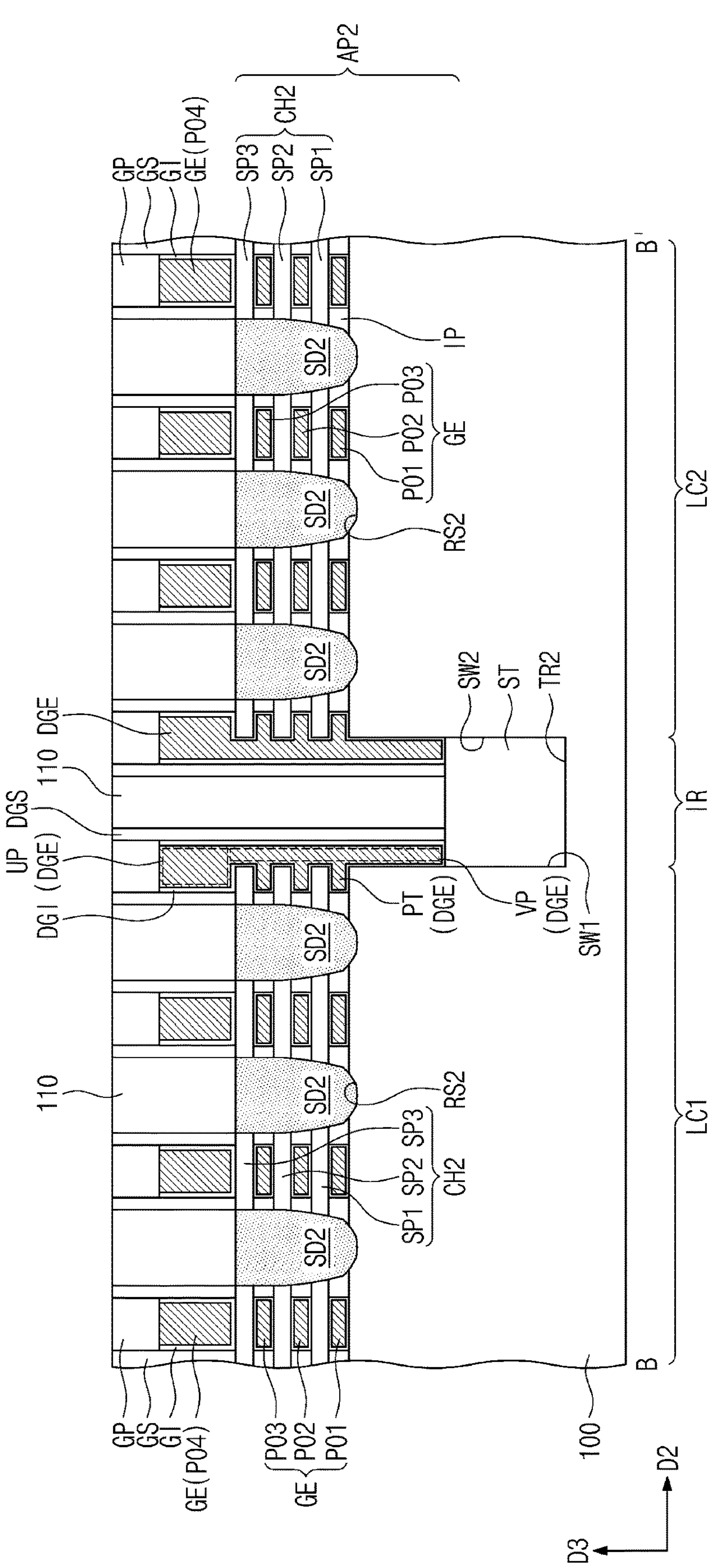
Figure 15C:
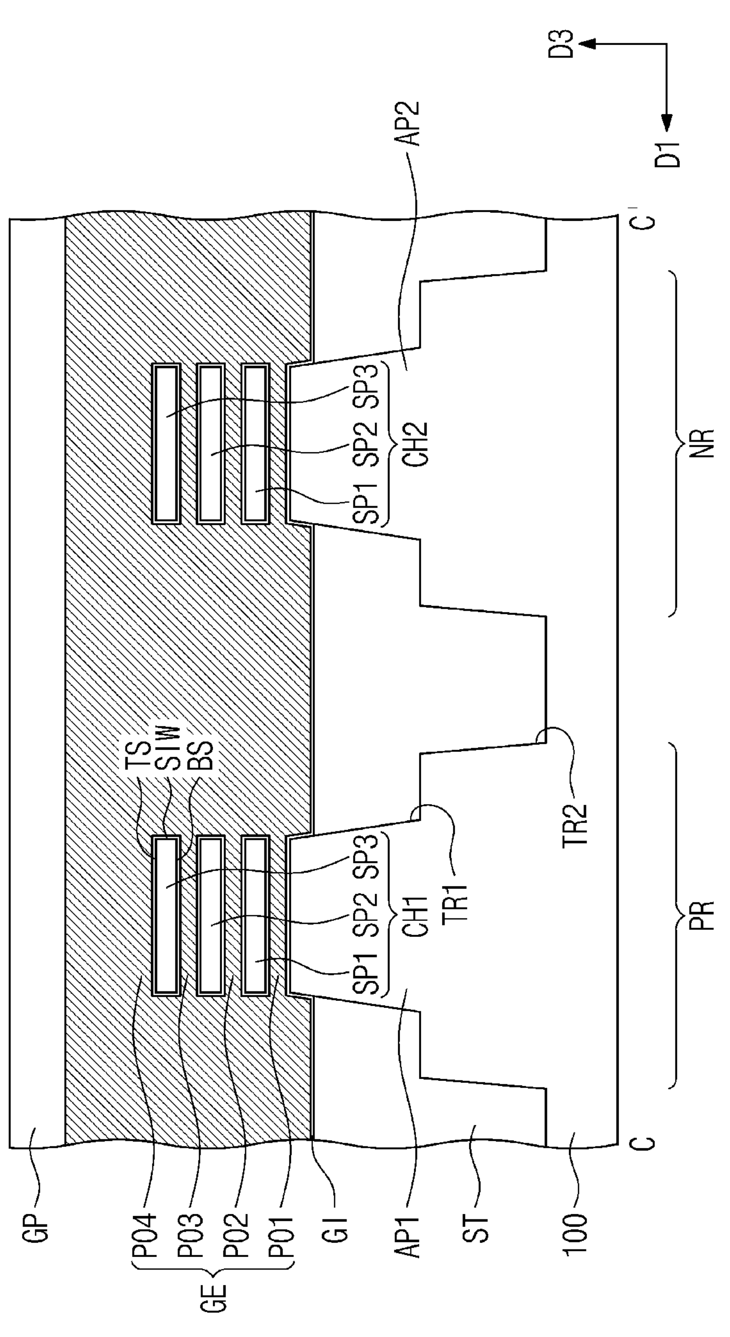

FIGS. 4, 6, 8, 10, 12, 14, and 16 illustrate plan views showing a method of manufacturing a semiconductor device, according to embodiments. FIGS. 5, 7A, 9A, 11A, 13A, 15A, and 17A illustrate cross-sectional views taken along line A-A' of FIGS. 4, 6, 8, 10, 12, 14, and 16, respectively. FIGS. 7B, 9B, 11B, 13B, 15B, and 17B illustrate cross-sectional views taken along line B-B' of FIGS. 6, 8, 10, 12, 14, and 16, respectively. FIGS. 11C, 13C, and 15C illustrate cross-sectional views taken along line C-C' of FIGS. 10, 12, and 14, respectively. FIGS. 11D and 13D illustrate cross-sectional views taken along line D-D' of FIGS. 10 and 12, respectively.

Figure 5:
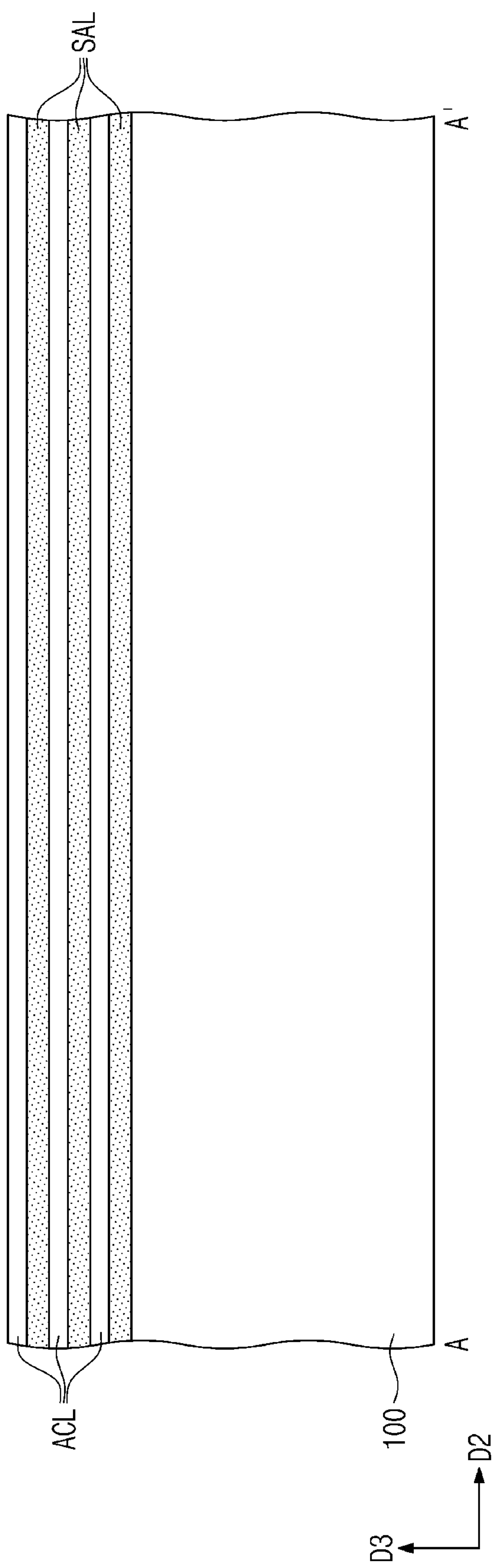
FIGS. 5, 7A, 9A, 11A, 13A, 15A, and 17A illustrate cross-sectional views taken along line A-A' of FIGS. 4, 6, 8, 10, 12, 14, and 16, respectively.

Referring to FIGS. 4 and 5, sacrificial layers SAL and active layers ACL may be alternately stacked on a substrate 100. The sacrificial layers SAL may include one of silicon (Si), germanium (Ge), and silicon-germanium (SiGe), and the active layers ACL may include another of silicon (Si), germanium (Ge), and silicon-germanium (SiGe). For example, the sacrificial layers SAL may include silicon-germanium (SiGe), and the active layers ACL may include silicon (Si).

The sacrificial layers SAL and the active layers ACL may be formed by an epitaxial growth process in which the substrate 100 is used as a seed layer. The sacrificial layers SAL and the active layers ACL may be conformally formed on an entire surface of the substrate 100.

Figure 6:
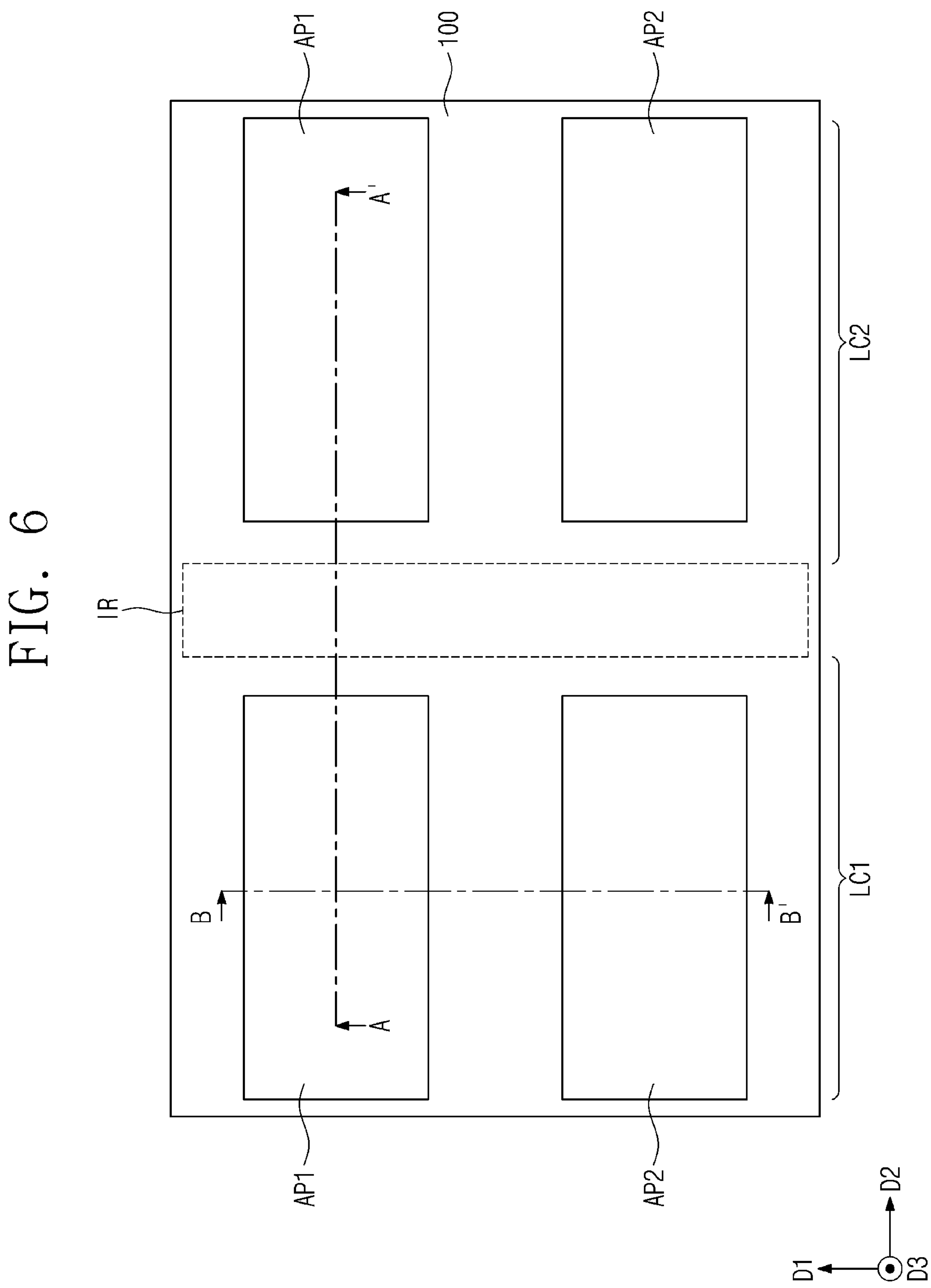
Figure 7A:
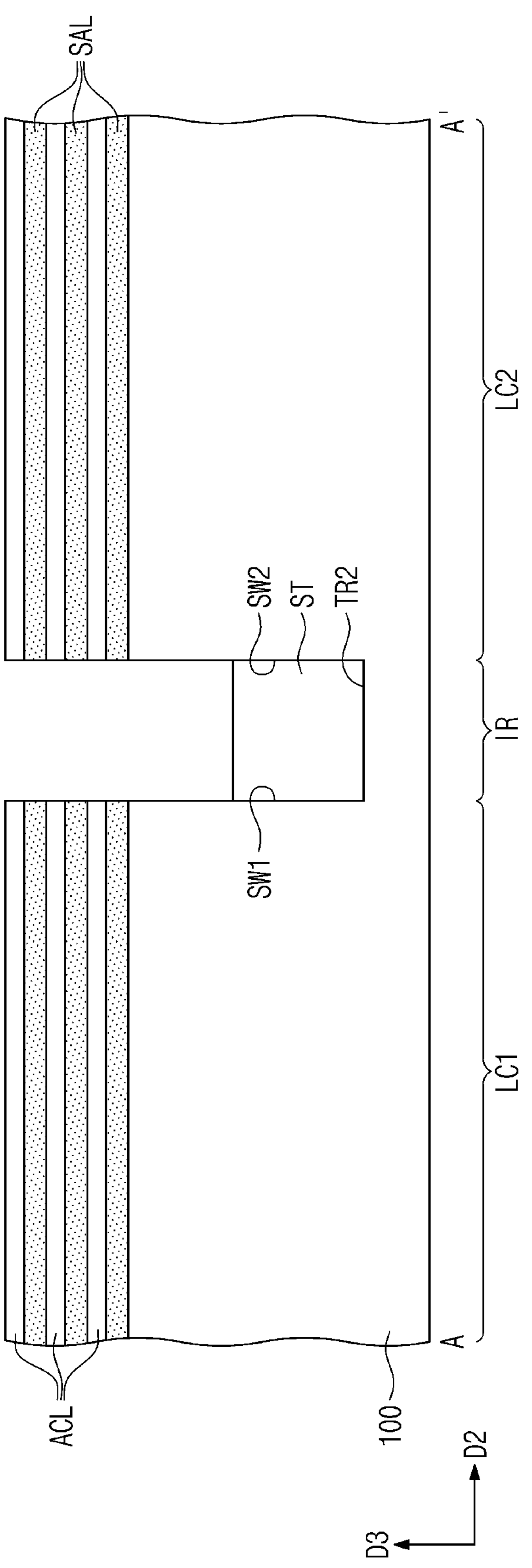
Figure 7B:
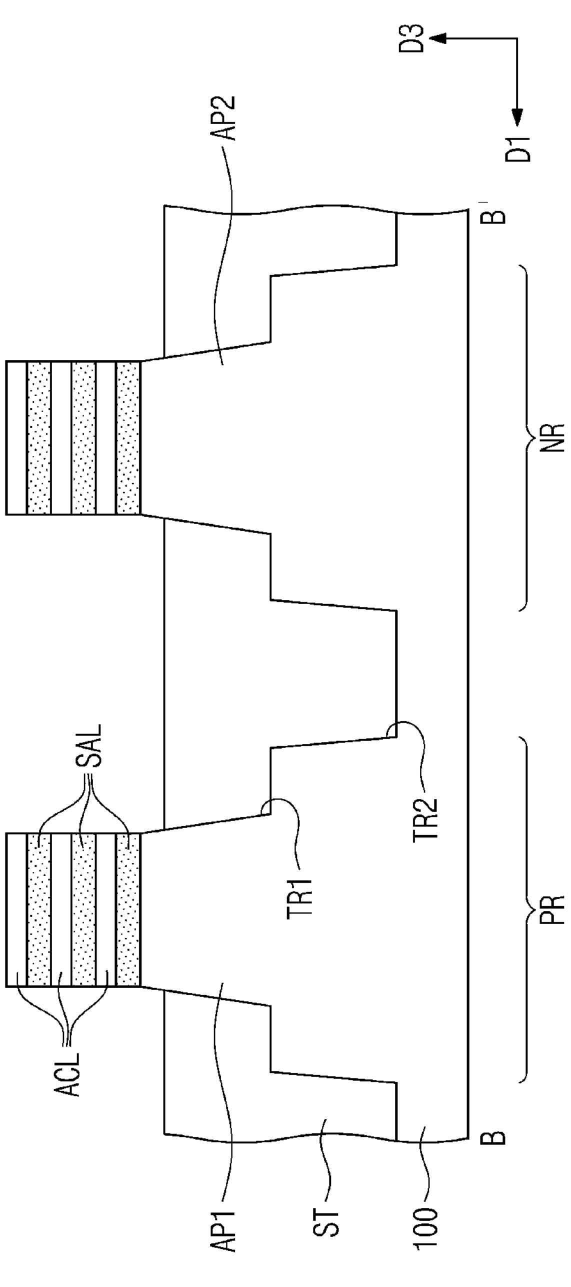
FIGS. 7B, 9B, 11B, 13B, 15B, and 17B illustrate cross-sectional views taken along line B-B' of FIGS. 6, 8, 10, 12, 14, and 16, respectively.

Referring to FIGS. 6, 7A, and 7B, mask patterns may be formed on a PMOS region PR and an NMOS region NR of the substrate 100. The mask patterns may each have a linear or bar shape that extends in a second direction D2.

A first patterning process may be performed in which the mask patterns are used as an etching mask to form a first trench TR1 that defines a first active pattern AP1 and a second active pattern AP2. The first active pattern AP1 and the second active pattern AP2 may be respectively formed in the PMOS region PR and the NMOS region NR. Each of the first and second active patterns AP1 and AP2 may include the sacrificial layers SAL and the active layers ACL that are alternately stacked on an upper portion thereof.

The substrate 100 may undergo a second patterning process to form a second trench TR2 that defines the PMOS region PR and the NMOS region NR. The second trench TR2 may be formed deeper than the first trench TR1. When viewed in plan, the second trench TR2 may include a part that extends in a first direction D1 and a part that extends in the second direction D2.

The second trench TR2 may define a first logic cell LC1 and a second logic cell LC2. The second trench TR2 may extend in the first direction D1 on an isolation region IR between the first logic cell LC1 and the second logic cell LC2.

The second trench TR2 may separate a single first active pattern AP1 into a pair of first active patterns AP1 that are adjacent to each other in the second direction D2. The second trench TR2 may include a first sidewall SW1 adjacent to the first logic cell LC1 and a second sidewall SW2 adjacent to the second logic cell LC2. The second trench TR2 may separate a single second active pattern AP2 into a pair of second active patterns AP2 that are adjacent to each other in the second direction D2.

A device isolation layer ST may be formed on the substrate 100 to fill the first and second trenches TR1 and TR2. The device isolation layer ST may include silicon oxide. The first and second active patterns AP1 and AP2 may have their upper portions that vertically protrude beyond the device isolation layer ST. The device isolation layer ST may fill a lower portion of the second trench TR2 that extends in the first direction D1 between the first logic cell LC1 and the second logic cell LC2. For example, the device isolation layer ST may be directly disposed on a lower portion of each of the first and second sidewalls SW1 and SW2 of the second trench TR2 that extends in the first direction D1.

Figure 8:
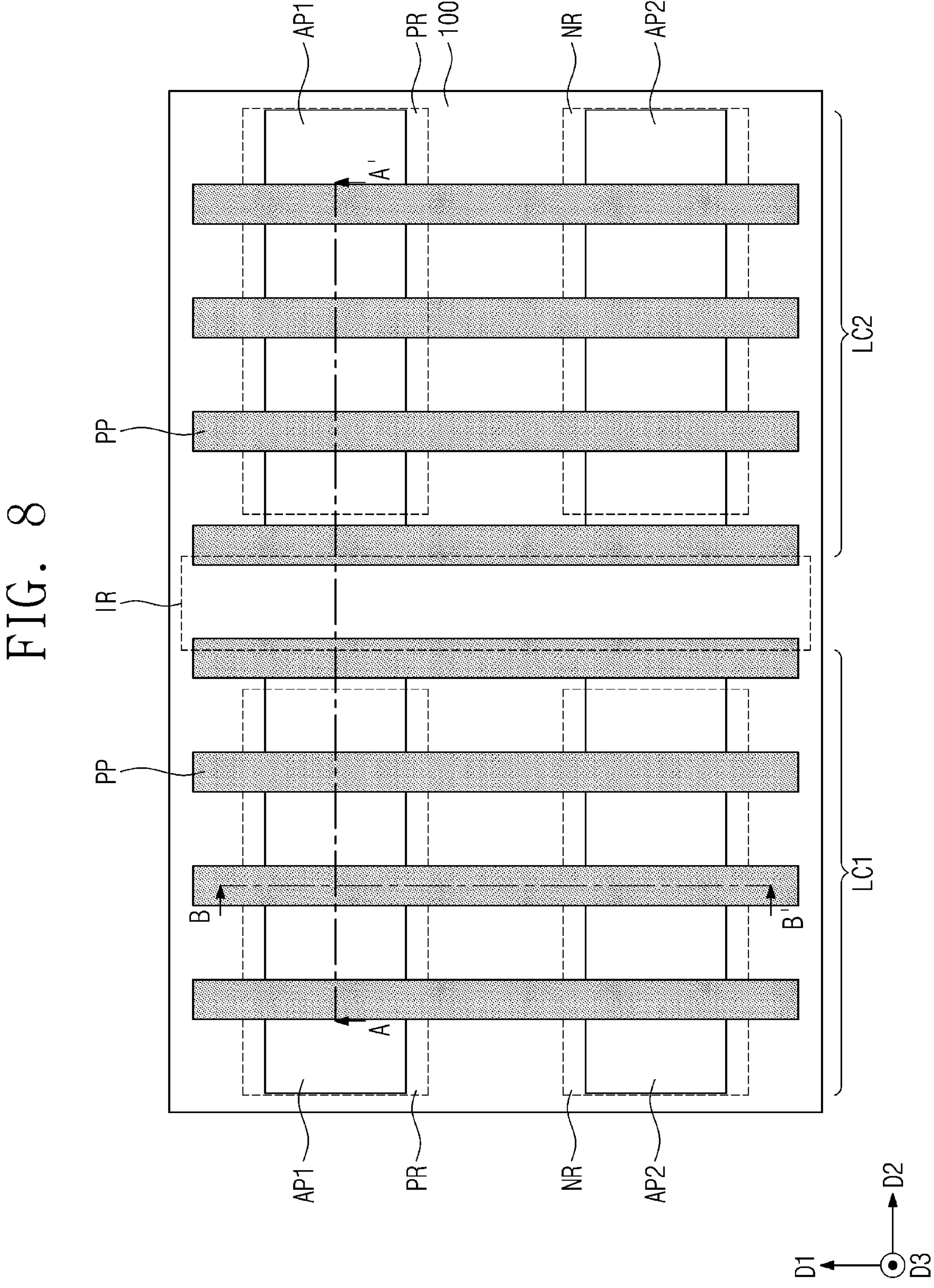
Figure 9A:
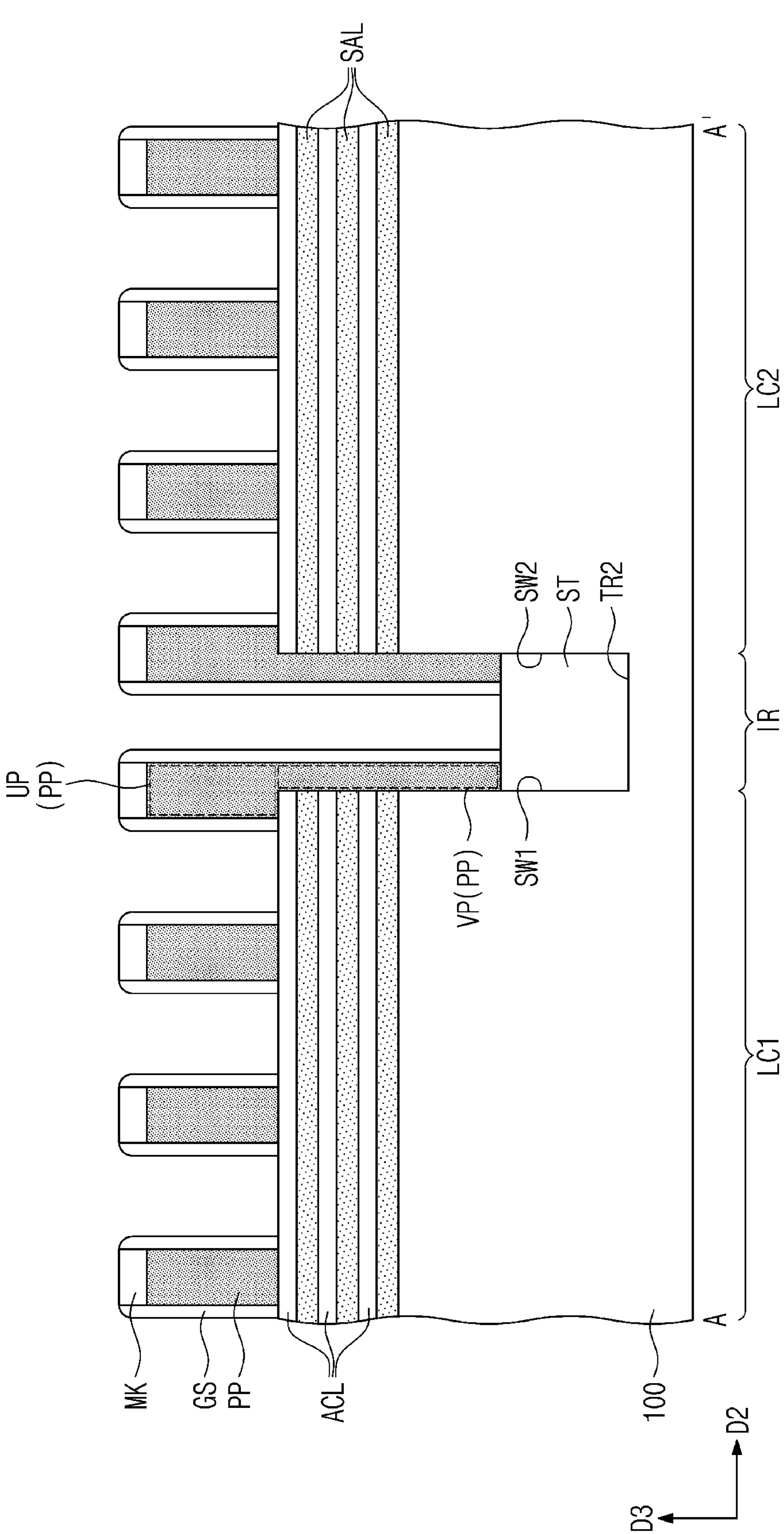
Figure 9B:
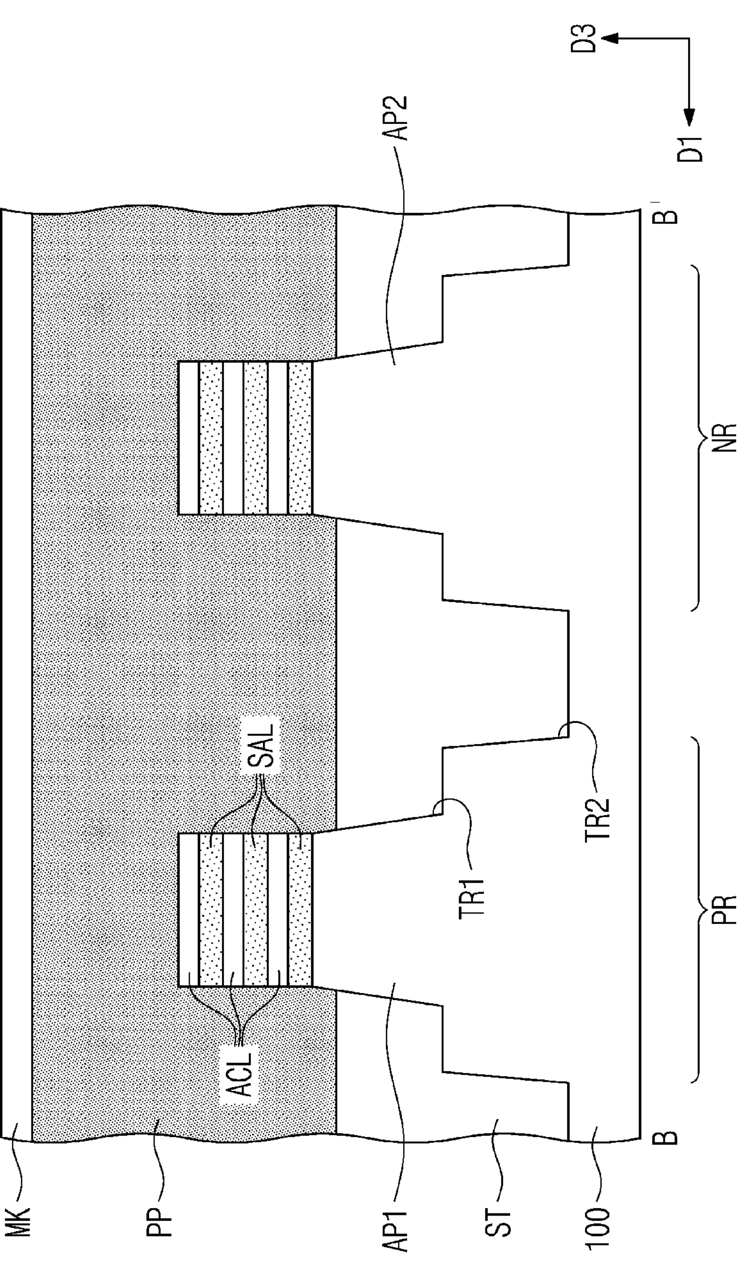
Figure 10:
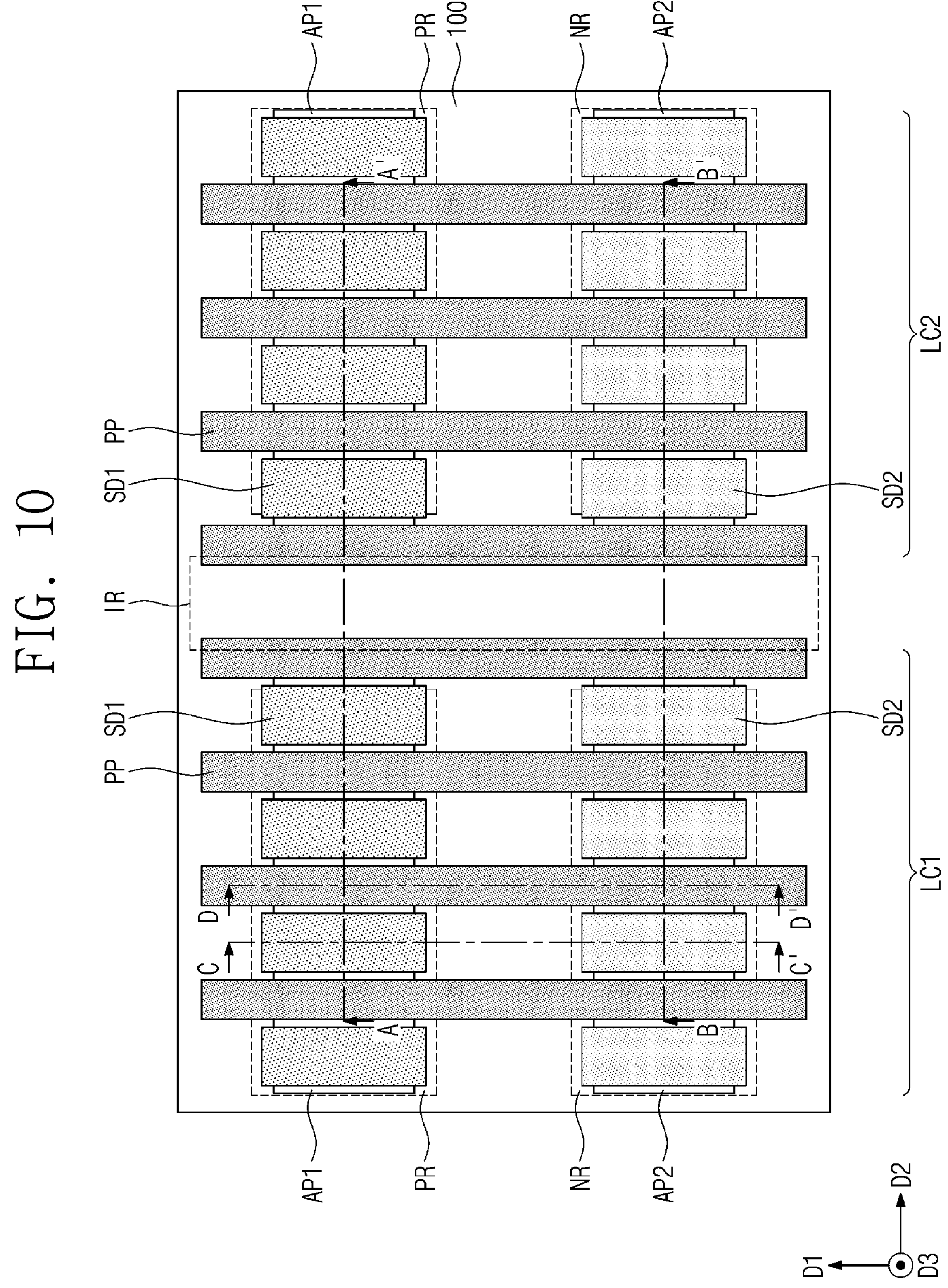

Referring to FIGS. 8, 9A, and 9B, sacrificial patterns PP may be formed on the substrate 100 to run across the first and second active patterns AP1 and AP2. Each of the sacrificial patterns PP may be formed to have a linear or bar shape that extends in the first direction D1. The sacrificial patterns PP may be arranged along the second direction D2 at a certain pitch.

For example, the formation of the sacrificial patterns PP may include forming a sacrificial layer on the entire surface of the substrate 100, forming hardmask patterns MK on the sacrificial layer, and using the hardmask patterns MK as an etching mask to pattern the sacrificial layer. The sacrificial layer may include polysilicon.

A pair of gate spacers GS may be formed on opposite sidewalls of each of the sacrificial patterns PP. The formation of the gate spacers GS may include conformally forming a gate spacer layer on the entire surface of the substrate 100 and anisotropically etching the gate spacer layer. The gate spacer layer may include at least one selected from SiCN, SiCON, and SiN. Alternatively, the gate spacer layer may be a multiple layer including at least two selected from SiCN, SiCON, and SiN.

Each of the sacrificial patterns PP adjacent to the second trench TR2 may include a body part UP and a vertical part VP that vertically extends from the body part UP along the first sidewall SW1 or the second sidewall SW2 of the second trench TR2.

Referring to FIGS. 10 and 11A to 11D, first recesses RS1 may be formed on an upper portion of the first active pattern AP1. Second recesses RS2 may be formed on an upper portion of the second active pattern AP2. While the first and second recesses RS1 and RS2 are formed, the device isolation layer ST may be recessed on opposite sides of each of the first and second active patterns AP1 and AP2 (see FIG. 11C).

For example, the formation of the first recesses RS1 may include using the hardmask patterns MK and the gate spacers GS as an etching mask to etch the upper portion of the first active pattern AP1. The first recess RS1 may be formed between a pair of sacrificial patterns PP. The second recesses RS2 on the upper portion of the second active pattern AP2 may be formed by the same method used for forming the first recesses RS1.

First source/drain patterns SD1 may be correspondingly formed in the first recesses RS1. For example, a selective epitaxial growth (SEG) process may be performed in which an inner wall of the first recess RS1 is used as a seed layer to form the first source/drain pattern SD1. The first source/drain pattern SD1 may be grown from a seed, or the substrate 100 and the active layers ACL exposed to the first recess RS1. The formation of the first source/drain patterns SD1 may define a first channel pattern CH1 between a pair of first source/drain patterns SD1. For example, the SEG process may include chemical vapor deposition (CVD) or molecular beam epitaxy (MBE). The first source/drain patterns SD1 may include a semiconductor element (e.g., SiGe) whose lattice constant is greater than that of a semiconductor element of the substrate 100. Each of the first source/drain patterns SD1 may be formed of a plurality of semiconductor layers. The active layers ACL between the pair of first source/drain patterns SD1 may be converted into a first semiconductor pattern SP1, a second semiconductor pattern SP2, and a third semiconductor pattern SP3 that constitute the first channel pattern CH1.

According to an embodiment, impurities may be in-situ implanted during the SEG process for forming the first source/drain patterns SD1. Alternatively, after the first source/drain pattern SD1 is formed, impurities may be implanted into the first source/drain pattern SD1. The first source/drain pattern SD1 may be doped with impurities to have a first conductivity type (e.g., p-type).

In the NMOS region, the sacrificial layers SAL exposed to the second recesses RS2 may be removed, and then inner spacers IP may be formed. Second source/drain patterns SD2 may be correspondingly formed in the second recesses RS2. For example, a selective epitaxial growth (SEG) process may be performed in which an inner wall of the second recess RS2 is used as a seed to form the second source/drain pattern SD2. The second source/drain pattern SD2 may include, for example, the same semiconductor element (e.g., Si) as that of the substrate 100. The second source/drain pattern SD2 may be doped to have a second conductivity type (e.g., n-type). The formation of the second source/drain patterns SD2 may define a second channel pattern CH2 between a pair of the second source/drain patterns SD2. The active layers ACL between the pair of second source/drain patterns SD2 may be converted into a first semiconductor pattern SP1, a second semiconductor pattern SP2, and a third semiconductor pattern SP3 that constitute the second channel pattern CH2.

Referring to FIGS. 12 and 13A to 13D, a first interlayer dielectric layer 110 may be formed to be disposed on the first and second source/drain patterns SD1 and SD2, the hardmask patterns MK, and the gate spacers GS. For example, the first interlayer dielectric layer 110 may include a silicon oxide layer.

The first interlayer dielectric layer 110 may be planarized until top surfaces of the sacrificial patterns PP are exposed. An etch-back or chemical mechanical polishing (CMP) process may be employed to planarize the first interlayer dielectric layer 110. The hardmask patterns MK may all be removed during the planarization process. As a result, the first interlayer dielectric layer 110 may have a top surface at a same level as those of the sacrificial patterns PP and those of the gate spacers GS.

The removal of the sacrificial patterns PP may form first empty spaces ET1 that expose the first and second active patterns AP1 and AP2. When the sacrificial pattern PP is removed, the first and second active patterns AP1 and AP2 may be exposed through the first empty space ET1. The first empty space ET1 may expose the sacrificial layers SAL of each of the first and second active patterns AP1 and AP2.

The sacrificial layers SAL exposed through the first empty space ET1 may be selectively removed. For example, an etching process that selectively etches the sacrificial layers SAL may be performed such that only the sacrificial layers SAL may be removed, and such that the first, second, and third semiconductor patterns SP1, SP2, and SP3 may remain. In this procedure, the inner spacers IP may prevent the occurrence of defects in the second source/drain pattern SD2.

Only the first, second, and third semiconductor patterns SP1, SP2, and SP3 may remain on each of the first and second active patterns AP1 and AP2. Second empty spaces ET2 may be formed in corresponding areas from which the sacrificial layers SAL are removed. The second empty spaces ET2 may be defined between the first, second, and third semiconductor patterns SP1, SP2, and SP3.

Referring to FIGS. 14 and 15A to 15C, a gate dielectric layer GI may be conformally formed in the first and second empty spaces ET1 and ET2. A gate electrode GE may be formed on the gate dielectric layer GI. The gate electrode GE may be formed to fill the first and second empty spaces ET1 and ET2. For example, the gate electrode GE may include first, second, and third parts PO1, PO2, and PO3 that fill the second empty spaces ET2. The gate electrode GE may further include a fourth part PO4 that fills the first empty space ET1. A gate capping pattern GP may be formed on the gate electrode GE.

The gate electrode GE adjacent to the second trench TR2 may be called a dummy gate electrode DGE. The gate spacer GS provided on a sidewall of the dummy gate electrode DGE may be called a dummy gate spacer DGS. The gate dielectric layer GI interposed between the dummy gate electrode DGE and the first channel pattern CH1 and between the dummy gate electrode DGE and the second channel pattern CH2 may be called a dummy gate dielectric layer DGI.

Figure 16:
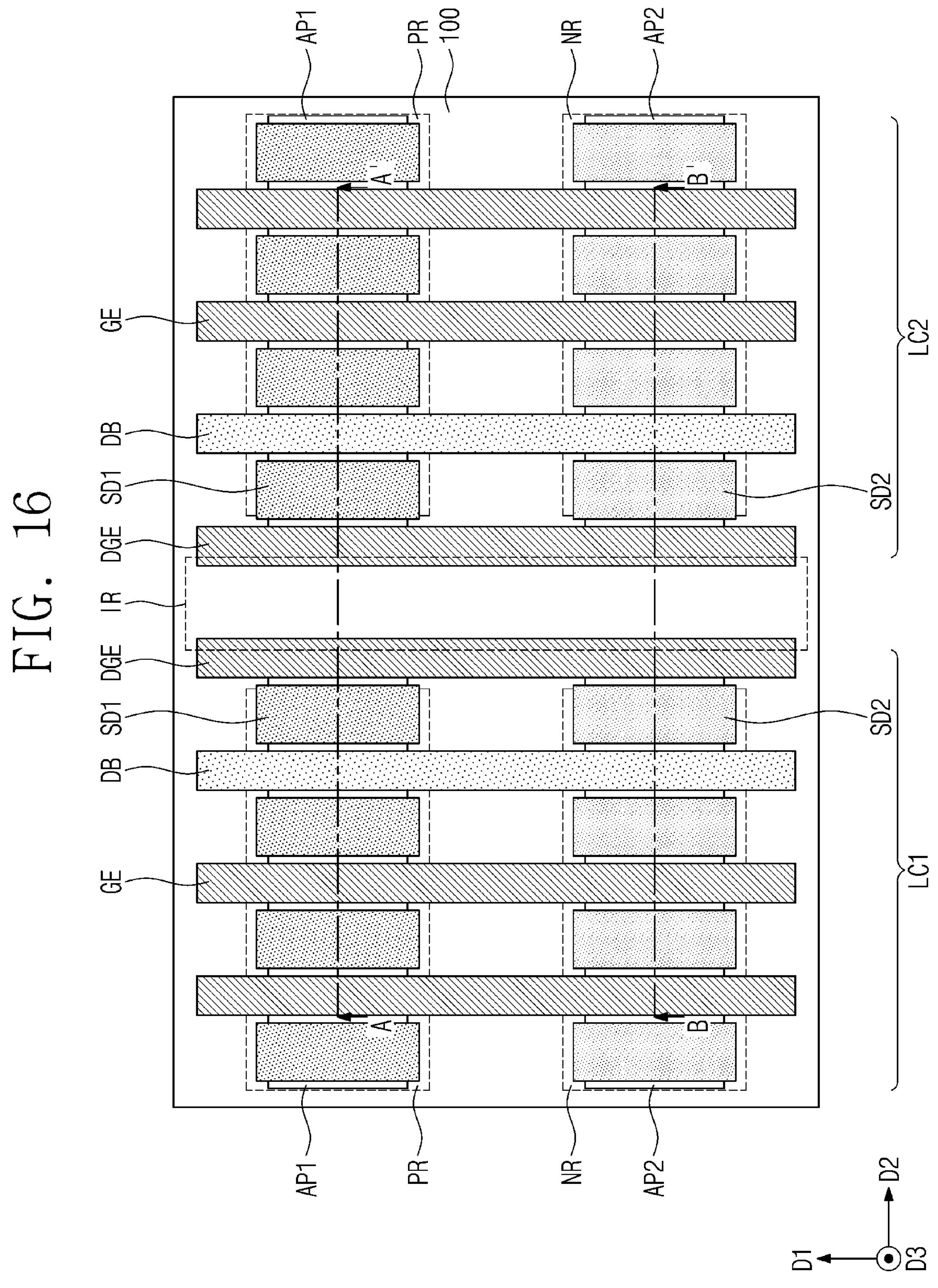
Figure 17A:
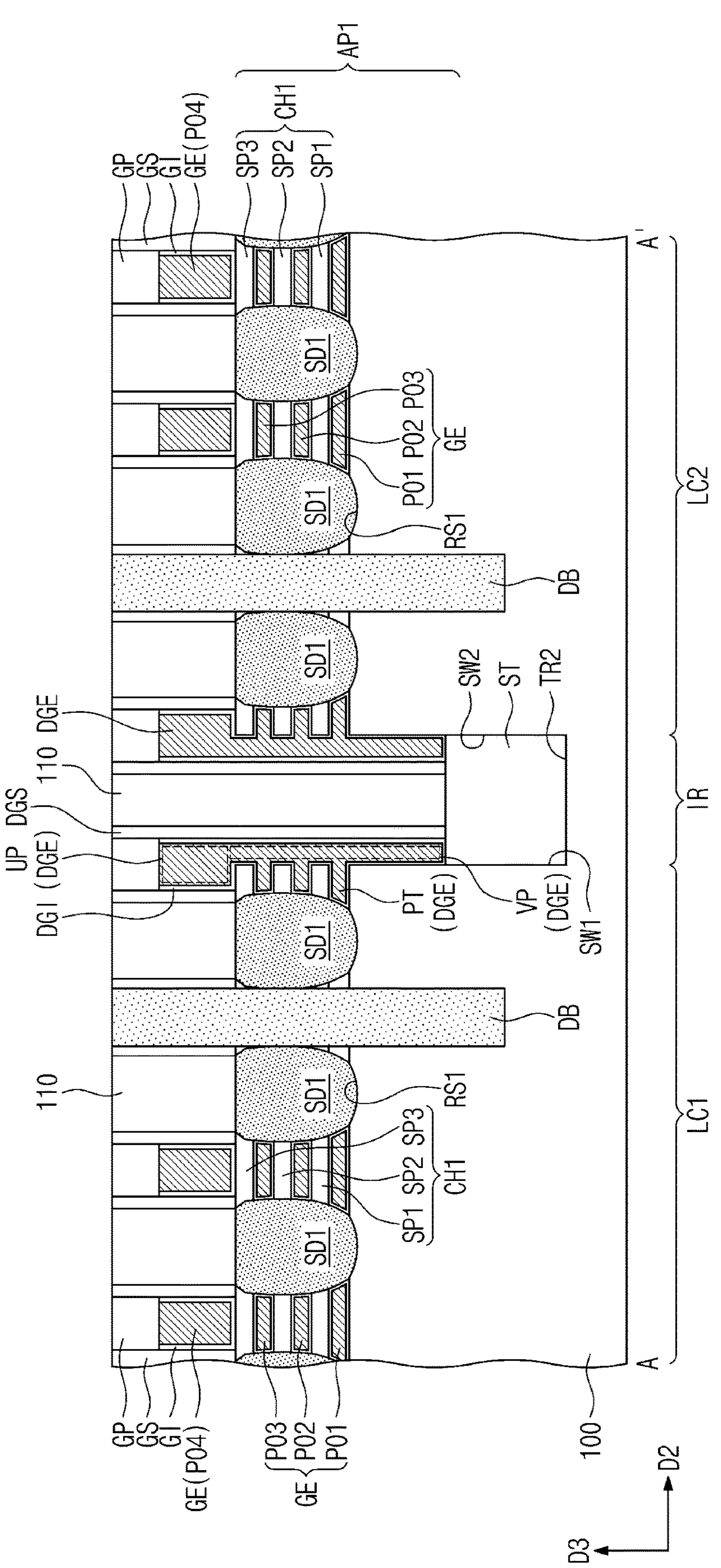
Figure 17B:
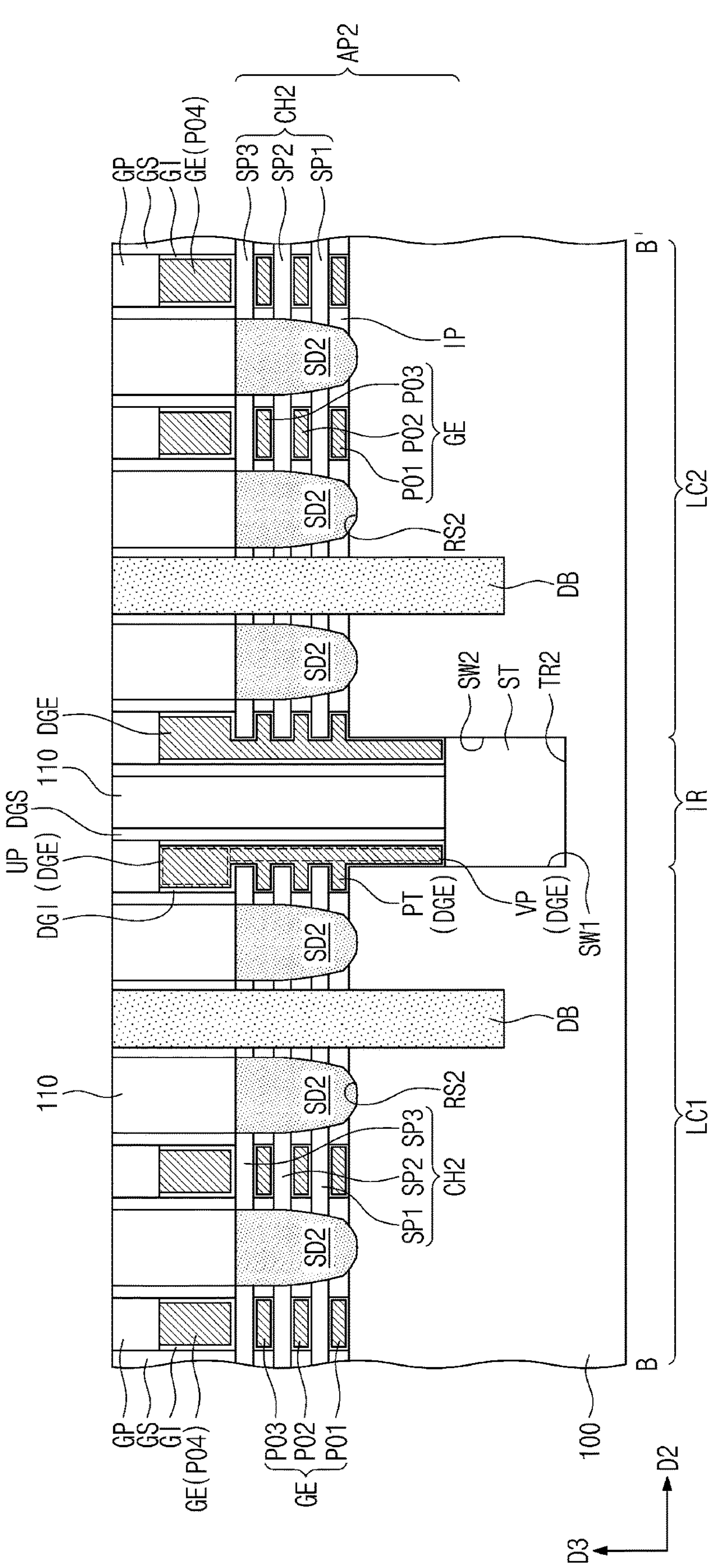

Referring to FIGS. 16, 17A, and 17B, a separation pattern DB may be formed between the dummy gate electrode DGE and the gate electrode GE. The formation of the separation pattern DB may include forming a hole by removing the gate electrode GE adjacent to the dummy gate electrode DGE, and filling the hole with a dielectric material.

The separation pattern DB may run across the first active pattern AP1 and the second active pattern AP2, while extending in the first direction D1. The separation pattern DB may include a different material from that of the device isolation layer ST. For example, the separation pattern DB may include silicon nitride. The separation pattern DB may be interposed between a pair of first source/drain patterns SD1 adjacent to an isolation region IR and between a pair of second source/drain patterns SD2 adjacent to the isolation region IR. The separation pattern DB may have a bottom surface lower than a bottom end of the first source/drain pattern SD1 and a bottom end of the second source/drain pattern SD2.

The separation pattern DB may have an upper sidewall in contact with the gate spacer GS. The bottom surface of the separation pattern DB may be disposed at a higher level than that of a bottom surface of the device isolation layer ST. Alternatively, the bottom surface of the separation pattern DB may be disposed at a level substantially the same as or lower than that of the bottom surface of the device isolation layer ST.

Referring back to FIGS. 1 and 2A to 2D, a second interlayer dielectric layer 120 may be formed on the first interlayer dielectric layer 110. The second interlayer dielectric layer 120 may include a silicon oxide layer. Active contacts AC may be formed to penetrate the second and first interlayer dielectric layers 120 and 110 and have electrical connection with the first and second source/drain patterns SD1 and SD2. A gate contact GC may be formed to penetrate the second interlayer dielectric layer 120 and the gate capping pattern GP and have electrical connection with the gate electrode GE.

A third interlayer dielectric layer 130 may be formed on the active contacts AC and the gate contacts GC. A first metal layer M1 may be formed in the third interlayer dielectric layer 130. A fourth interlayer dielectric layer 140 may be formed on the third interlayer dielectric layer 130. A second metal layer M2 may be formed in the fourth interlayer dielectric layer 140.

Figure 18:
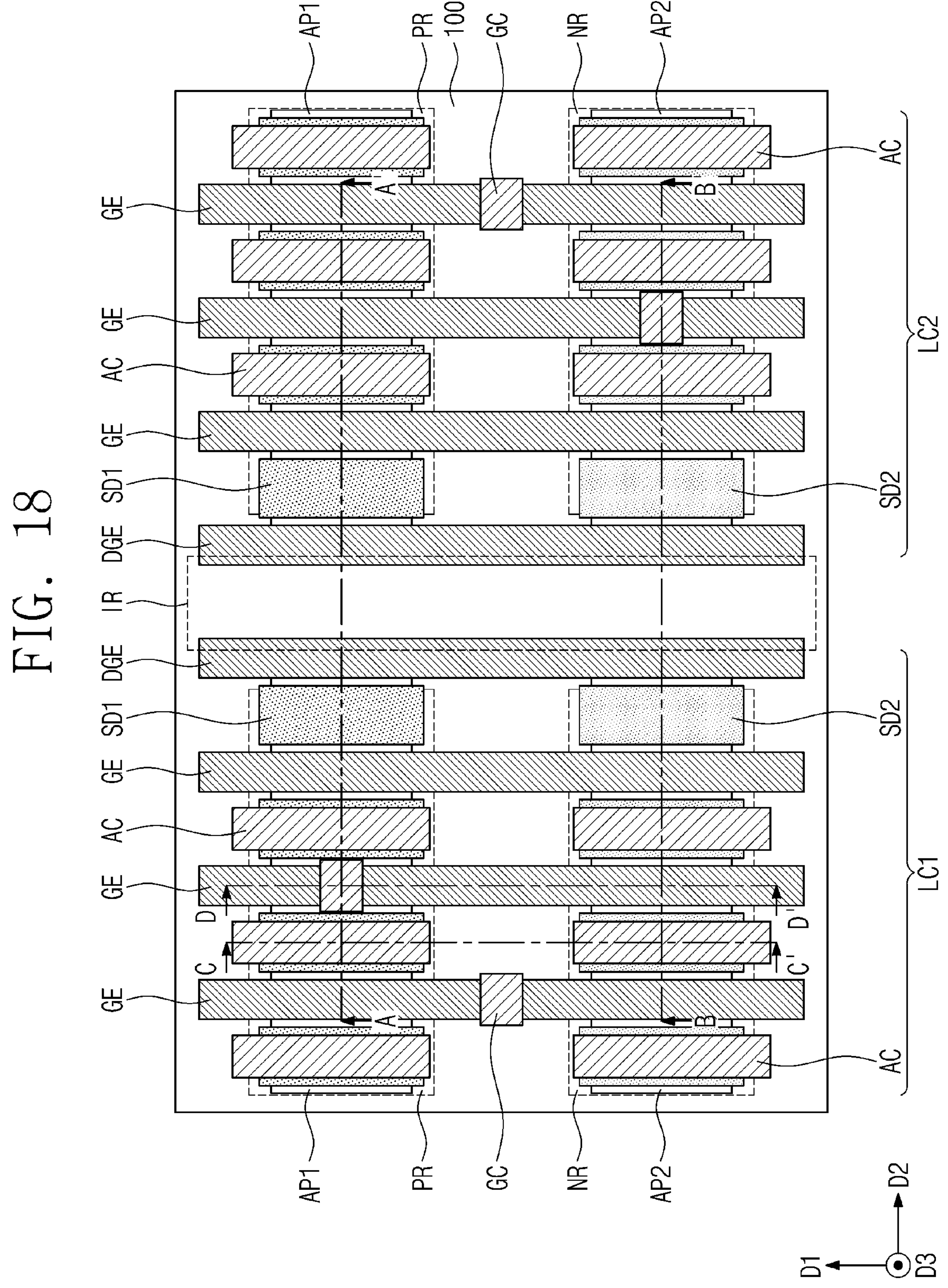
FIG. 18 illustrates a plan view showing a semiconductor device according to embodiments.
Figure 19A:
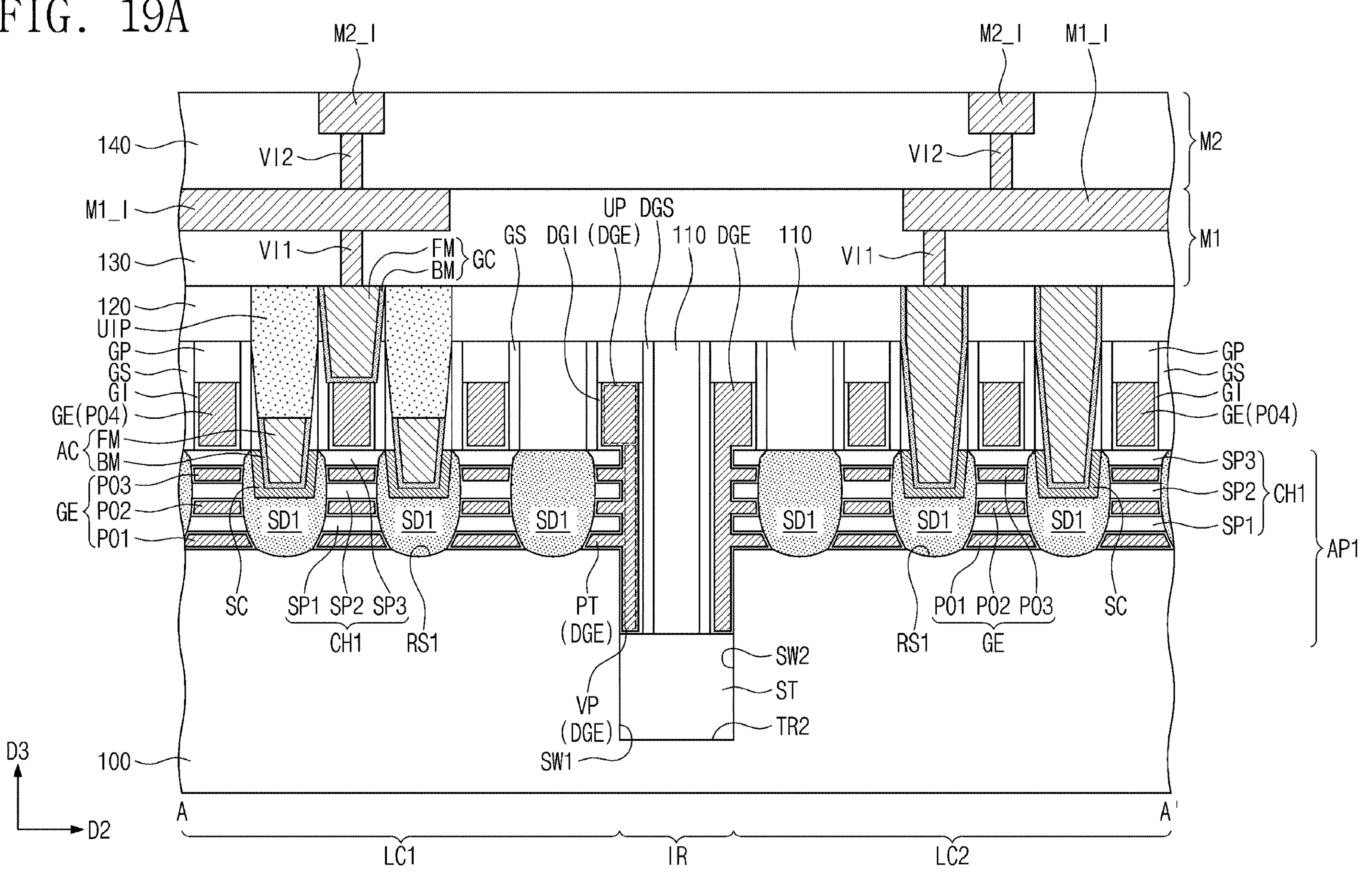
FIGS. 19A and 19B illustrate cross-sectional views respectively taken along lines A-A' and B-B' of FIG. 18.
Figure 19B:
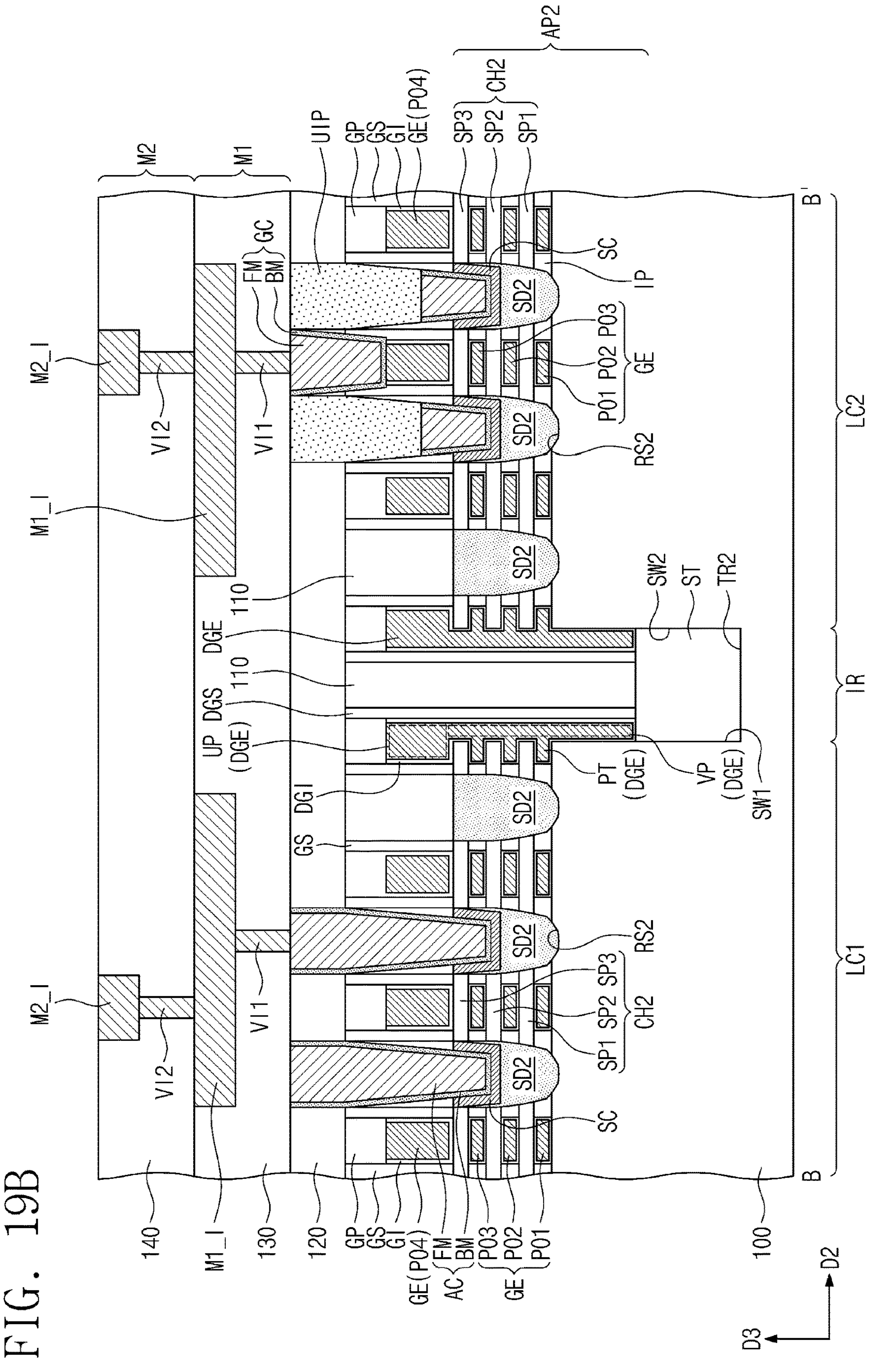

FIG. 18 illustrates a plan view showing a semiconductor device according to embodiments. FIGS. 19A and 19B illustrate cross-sectional views respectively taken along lines A-A' and B-B' of FIG. 18. In the embodiment that follows, a detailed description of technical features repetitive to those discussed above with reference to FIGS. 1 and 2A to 2D will be omitted, and a difference thereof will be discussed in detail.

Referring to FIGS. 18, 19A, and 19B, the gate contact GC may not be provided on the gate electrode GE adjacent to the dummy gate electrode DGE. According to embodiments, the separation pattern DB discussed with reference to FIGS. 1 and 2A to 2D may be omitted, and instead, no electrical connection may be provided to the gate electrode GE adjacent to the dummy gate electrode DGE. Therefore, even when there occur defects discussed with reference to FIG. 3, there may be no reduction in electrical properties of a semiconductor device.

Figure 20:
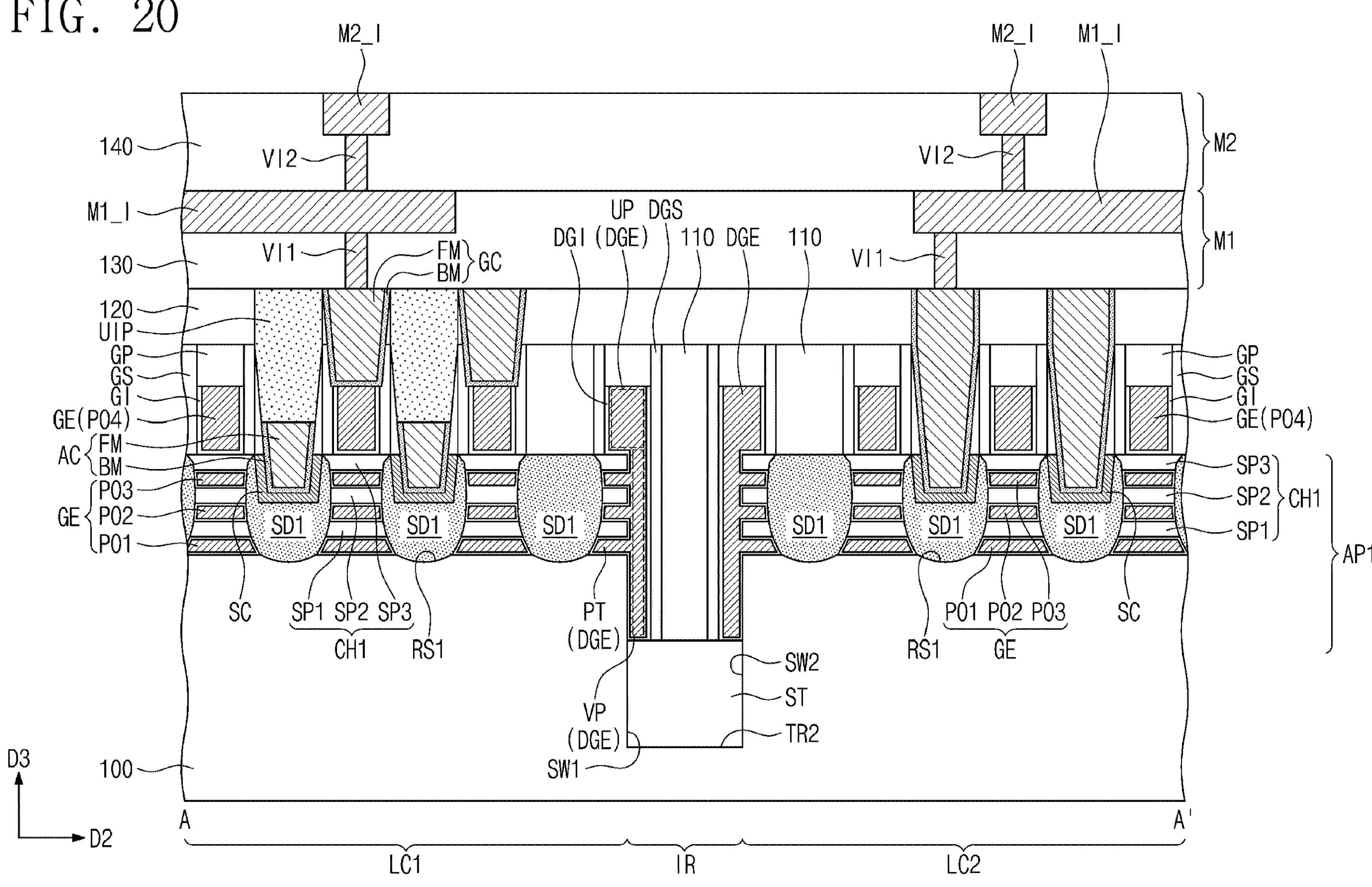
FIG. 20 illustrates a cross-sectional view taken along line A-A' of FIG. 18, showing a semiconductor device, according to embodiments.

FIG. 20 illustrates a cross-sectional view taken along line A-A' of FIG. 18, showing a semiconductor device according to embodiments. In the embodiment that follows, a detailed description of features repetitive to those discussed above with reference to FIGS. 18, 19A, and 19B will be omitted, and a difference thereof will be discussed in detail.

Referring to FIGS. 18 and 20, the gate contact GC may be provided on the gate electrode GE adjacent to the dummy gate electrode DGE, and the first via VI1 may be omitted between the gate contact GC and the first line M1_I. For example, no electrical connection may be provided to the gate electrode GE adjacent to the dummy gate electrode DGE. The gate contact GC may be provided on the gate electrode GE adjacent to the dummy gate electrode DGE, and thus the gate contact GC may additionally increase in density (or the number of the gate contacts GC per unit area). For example, the number of the gate contacts GC may increase to be equal to or similar to that of other transistors. Therefore, it may be possible to reduce process defects caused by loading effects and to prevent the occurrence of step difference during a planarization process.

Figure 21:
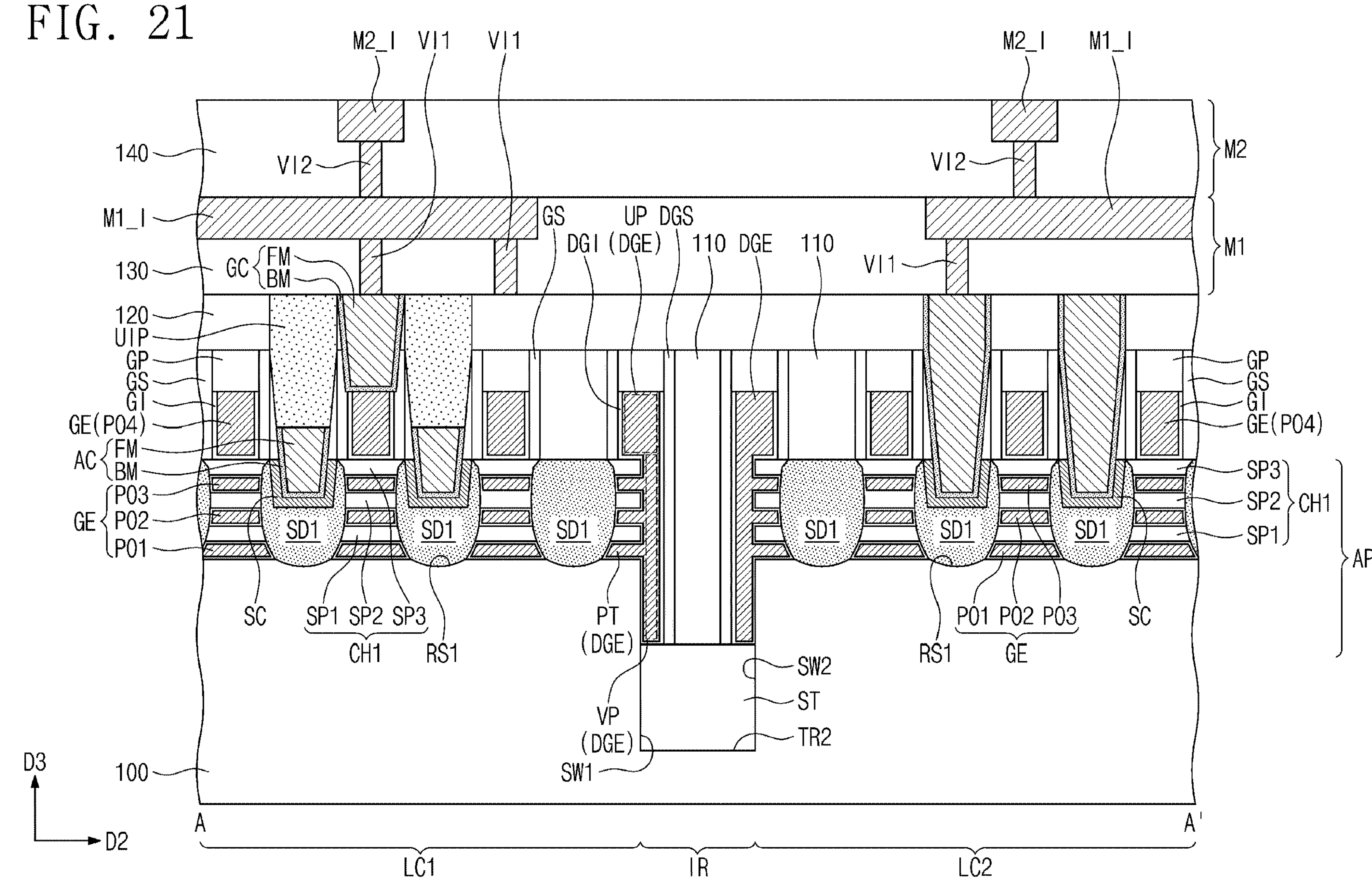
FIG. 21 illustrates a cross-sectional view taken along line A-A' of FIG. 18, showing a semiconductor device, according to embodiments.
Figure 22A:
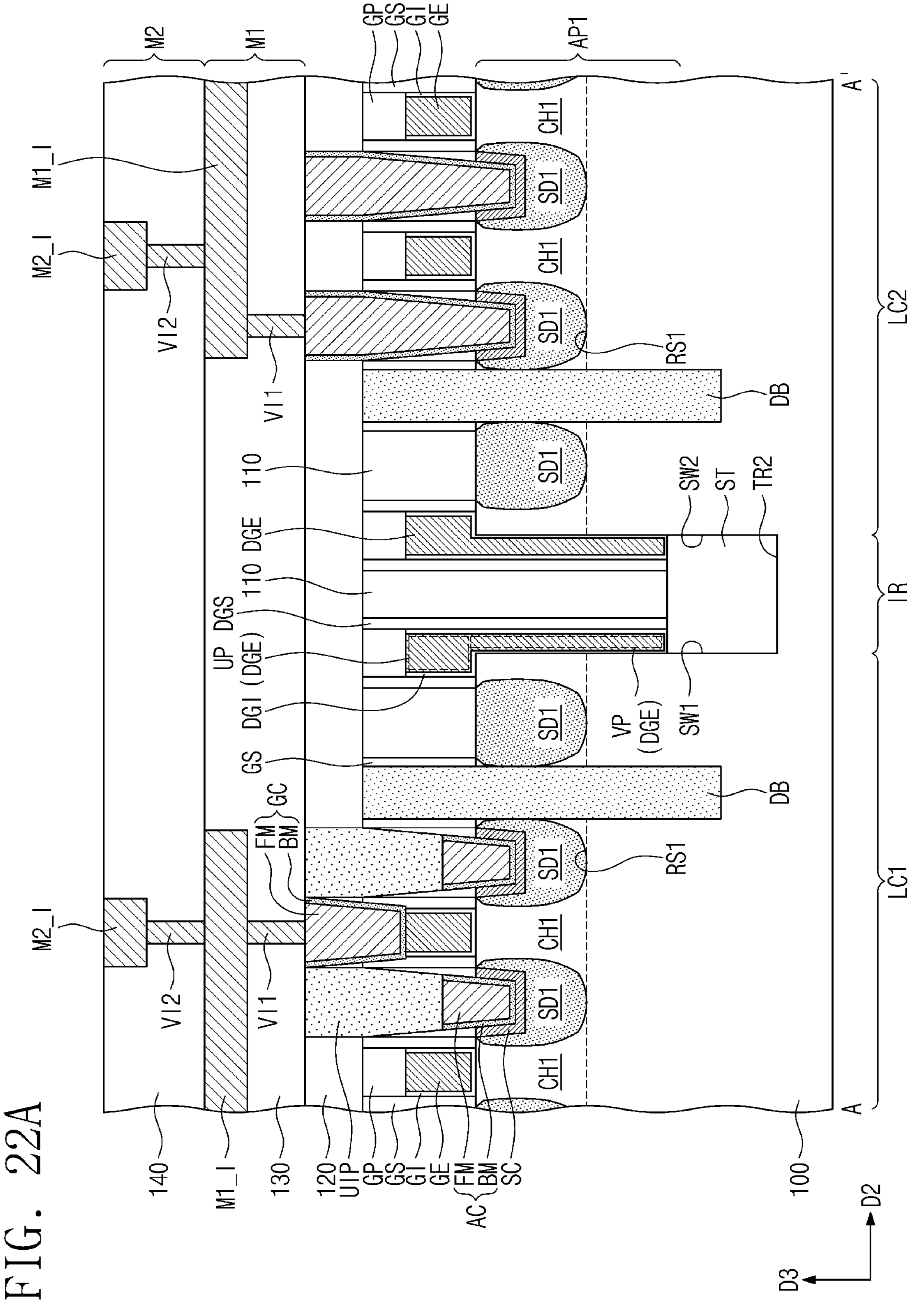
FIGS. 22A, 22B, 22C, and 22D illustrate cross-sectional views respectively taken along lines A-A', B-B', C-C', and D-D' of FIG. 1, showing a semiconductor device, according to embodiments.
Figure 22B:
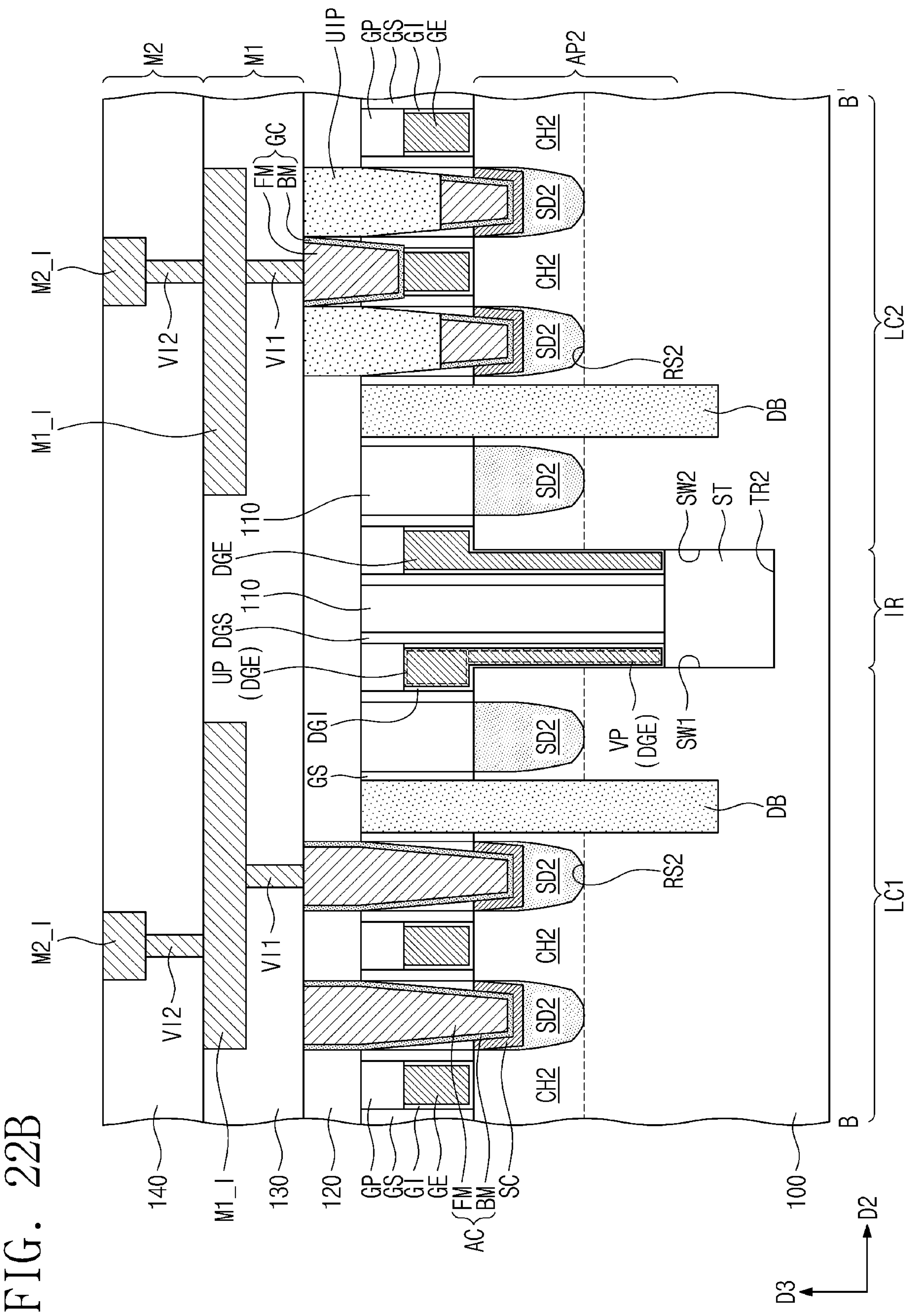
Figure 22C:
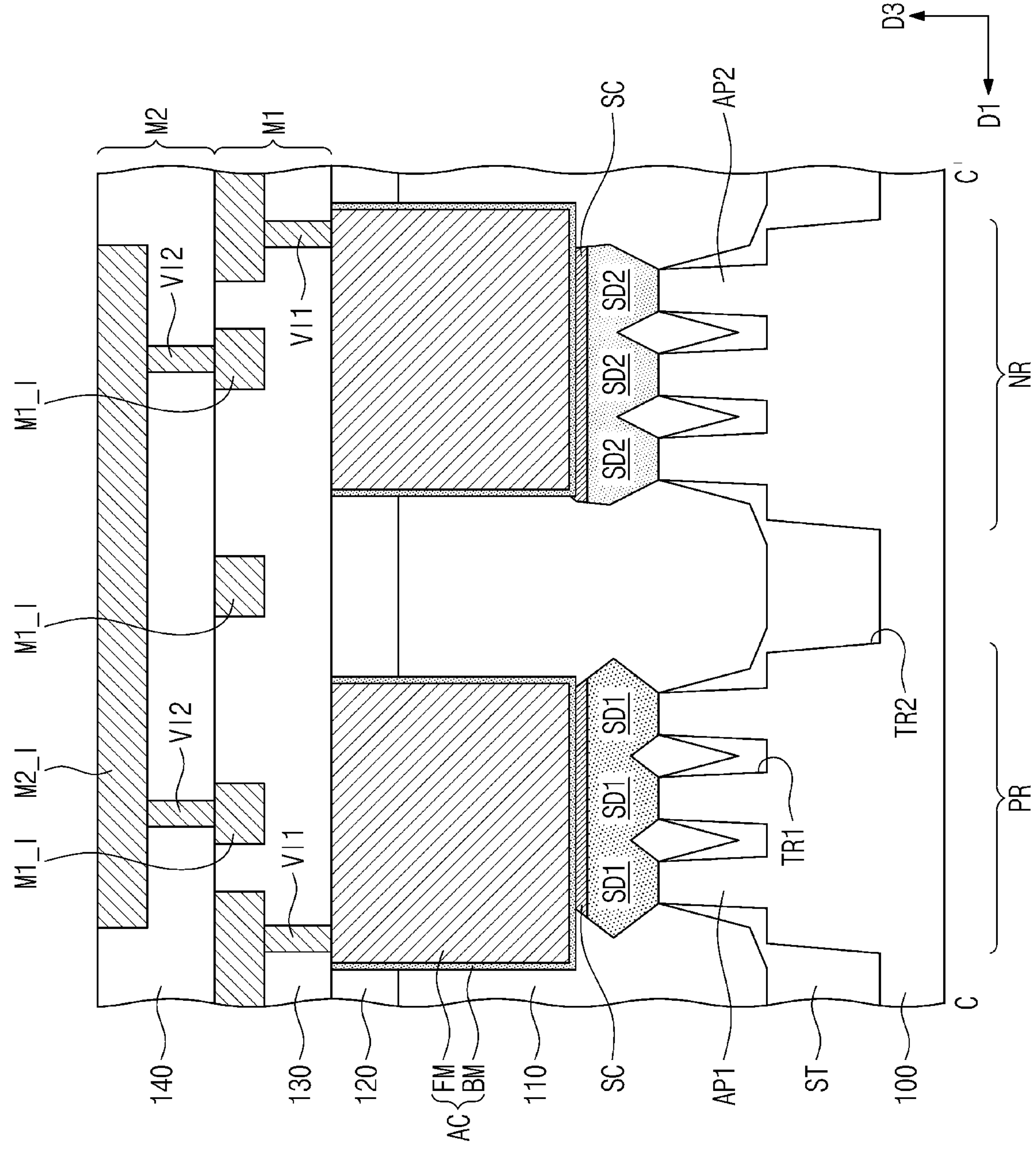
Figure 22D:
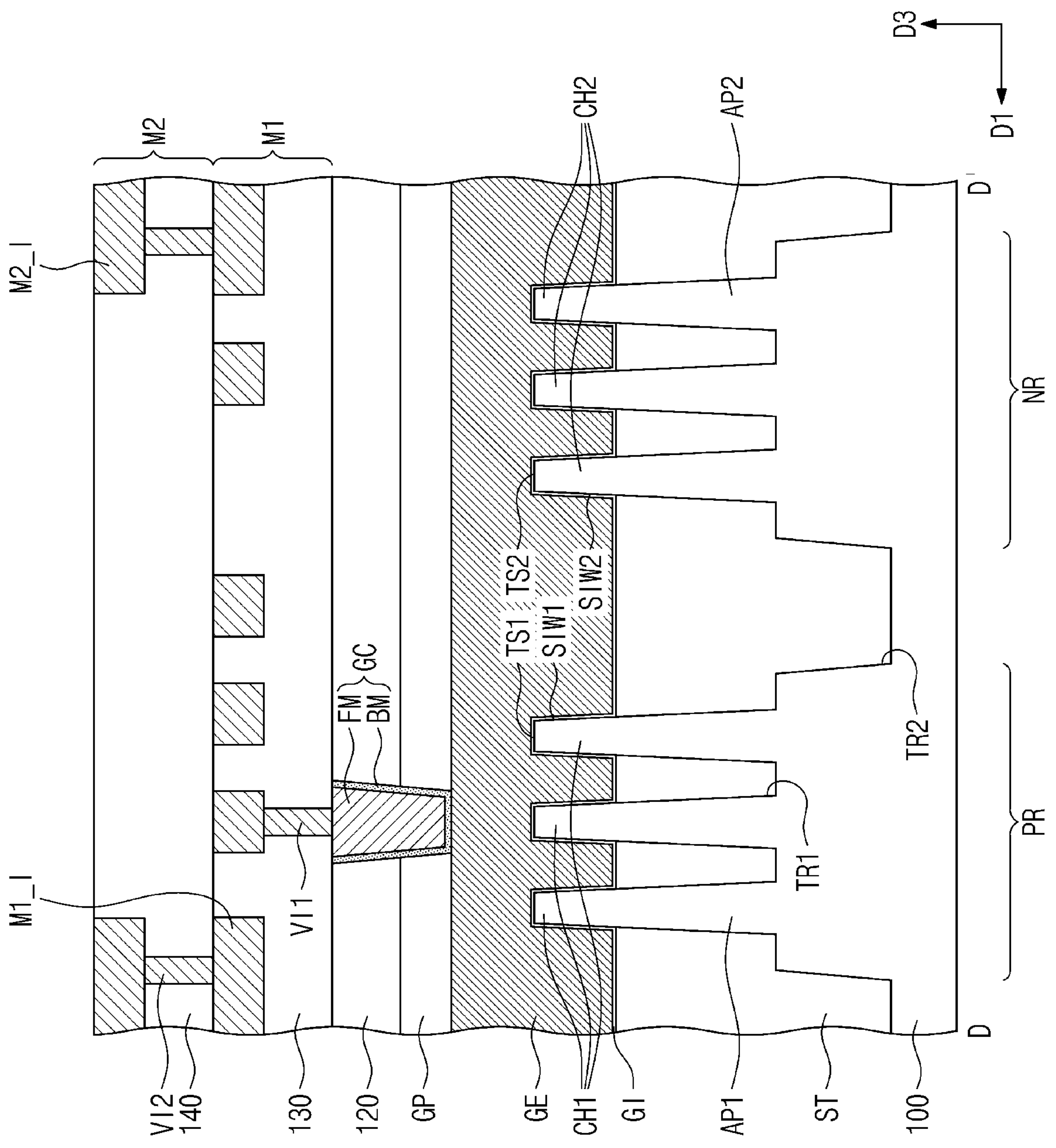

FIG. 21 illustrates a cross-sectional view taken along line A-A' of FIG. 18, showing a semiconductor device according to embodiments. In the embodiment that follows, a detailed description of features repetitive to those discussed above with reference to FIGS. 18, 19A, and 19B will be omitted, and a difference thereof will be discussed in detail.

Referring to FIGS. 18 and 21, the first via VI1 may be provided on the gate electrode GE adjacent to the dummy gate electrode DGE, and the gate contact GC may be omitted between the first via VI1 and the gate electrode GE adjacent to the dummy gate electrode DGE. For example, no electrical connection may be provided to the gate electrode GE adjacent to the dummy gate electrode DGE. The first via VI1 may be provided to vertically overlap the gate electrode GE adjacent to the dummy gate electrode DGE, and thus the first via VI1 may additionally increase in density (or the number of the first vias VI1 per unit area). For example, the number of the first vias VI1 may be increase to be equal to or similar to that of other transistors. Therefore, it may be possible to reduce process defects caused by loading effects and to prevent the occurrence of step difference during a planarization process.

FIGS. 22A, 22B, 22C, and 22D illustrate cross-sectional views respectively taken along lines A-A', B-B', C-C', and D-D' of FIG. 1, showing a semiconductor device, according to embodiments. In the embodiment that follows, a detailed description of technical features repetitive to those discussed above with reference to FIGS. 1 and 2A to 2D will be omitted, and a difference thereof will be discussed in detail.

Referring to FIGS. 1 and 22A to 22D, the second trench TR2 formed on the upper portion of the substrate 100 may define the PMOS region PR and the NMOS region NR. The first trench TR1 may be defined between neighboring first active patterns AP1 and between neighboring second active patterns AP2. The first trench TR1 may be shallower than the second trench TR2.

The device isolation layer ST may fill the first and second trenches TR1 and TR2. The first and second active patterns AP1 and AP2 may have their upper portions that vertically protrude beyond the device isolation layer ST. The first and second active patterns AP1 and AP2 may each have a fin shape at the upper portion thereof. The device isolation layer ST may not be disposed on the upper portion of the first active pattern AP1 and the upper portion of the second active pattern AP2. The device isolation layer ST may be disposed on a lower sidewall of each of the first and second active patterns AP1 and AP2.

The first source/drain patterns SD1 may be provided on the upper portions of the first active patterns AP1. The first source/drain patterns SD1 may be impurity regions each having a first conductivity type (e.g., p-type). The first channel pattern CH1 may be interposed between a pair of first source/drain patterns SD1. The second source/drain patterns SD2 may be provided on the upper portions of the second active patterns AP2. The second source/drain patterns SD2 may be impurity regions each having a second conductivity type (e.g., n-type). The second channel pattern CH2 may be interposed between a pair of second source/drain patterns SD2.

The first and second source/drain patterns SD1 and SD2 may be epitaxial patterns formed by a selective epitaxial growth process. For example, the first and second source/drain patterns SD1 and SD2 may have their top surfaces at a same level as those of the first and second channel patterns CH1 and CH2. As another example, the first and second source/drain patterns SD1 and SD2 may have their top surfaces higher than those of the first and second channel patterns CH1 and CH2.

The gate electrodes GE may be provided to extend in the first direction D1, while running across the first and second active patterns AP1 and AP2. The gate electrodes GE may vertically overlap the first and second channel patterns CH1 and CH2. Each of the gate electrodes GE may surround a top surface and opposite sidewall sidewalls of each of the first and second channel patterns CH1 and CH2.

Referring back to FIG. 22D, the gate electrode GE may be provided on a first top surface TS1 and at least one first sidewall SIW1 of the first channel pattern CH1. The gate electrode GE may be provided on a second top surface TS2 and at least one second sidewall SIW2 of the second channel pattern CH2. According to an embodiment, a transistor according to the present embodiment may be a three-dimensional fin field-effect transistor (e.g., FinFET) in which the gate electrode GE three-dimensionally surrounds the first and second channel patterns CH1 and CH2.

Different from the dummy gate electrode DGE discussed with reference to FIGS. 1 and 2A to 2D, in the present embodiment, the dummy gate electrode DGE may not include the protrusion PT. The separation pattern DB, the gate electrode GE, the active contact AC, the first metal layer M1, and the second metal layer M2 may be substantially the same as those discussed with reference to FIGS. 1 and 2A to 2D.

According to the above embodiments, a separation pattern may be provided between a gate electrode and a dummy gate electrode formed adjacent to the second trench. Therefore, even when an insufficient thickness is given to a recess in which a source/drain pattern is formed, neighboring gate electrodes may be prevented from being connected to each other. As a result, it may be possible to prevent malfunction and to increase reliability and electrical properties of semiconductor devices.

Although the disclosure has been described in connection with the above embodiments illustrated in the accompanying drawings, it will be understood by one of ordinary skill in the art that variations in form and detail may be made therein without departing from the spirit and essential feature of the disclosure. The above disclosed embodiments should thus be considered illustrative and not restrictive.

What is claimed is:

1. A semiconductor device, comprising:

a substrate comprising a first active pattern extending in a first direction, the first active pattern being separated into a pair of first active patterns by a trench extending in a second direction intersecting the first direction;

a device isolation layer that fills a lower portion of the trench;

a plurality of first source/drain patterns on the first active pattern;

a first channel pattern connected to the plurality of first source/drain patterns, the first channel pattern comprising a plurality of semiconductor patterns that are stacked and spaced apart from each other;

a first dummy gate electrode extending in the second direction, and being adjacent to a first sidewall of the trench;

a gate electrode spaced apart in the first direction from the first dummy gate electrode, the gate electrode extending in the second direction across the first channel pattern;

a gate capping pattern on the gate electrode;

a gate contact coupled to the gate electrode; and a separation pattern extending in the second direction between the gate electrode and the first dummy gate electrode, wherein, in the first direction, the separation pattern is between adjacent ones of the plurality of first source/drain patterns, wherein a top surface of the separation pattern is at a same level as a top surface of the gate capping pattern.

2. The semiconductor device of claim 1, wherein:

a bottom surface of the separation pattern is at a level lower than bottom ends of the plurality of first source/drain patterns.

3. The semiconductor device of claim 1, wherein the separation pattern comprises a material different from a material of the device isolation layer.

4. The semiconductor device of claim 1, wherein the first dummy gate electrode comprises:

a body part;

a vertical part vertically and downwardly extending from the body part along the first sidewall of the trench; and a protruding part protruding from the vertical part toward one of the plurality of first source/drain patterns.

5. The semiconductor device of claim 4, wherein a width of the vertical part is smaller than a width of the body part.

6. The semiconductor device of claim 1, further comprising:

a first gate spacer on a sidewall of the gate electrode;

a second gate spacer on an upper sidewall of the separation pattern; and a dummy gate spacer on a sidewall of the first dummy gate electrode.

7. The semiconductor device of claim 6, wherein the dummy gate spacer extends along the first sidewall of the trench to contact a top surface of the device isolation layer.

8. The semiconductor device of claim 1, wherein the gate electrode surrounds a top surface, a sidewall, and a bottom surface of each of the plurality of semiconductor patterns included in the first channel pattern.

9. The semiconductor device of claim 1, further comprising:

a second active pattern extending in the first direction, and being spaced apart in the second direction from the first active pattern, the trench separating the second active pattern into a pair of second active patterns;

a plurality of second source/drain patterns on the second active pattern; and a second channel pattern connected to the plurality of second source/drain patterns, wherein each of the gate electrode and the first dummy gate electrode extends in the second direction across the second channel pattern.

10. The semiconductor device of claim 1, wherein:

the trench comprises a second sidewall that faces the first sidewall; and the semiconductor device further comprises a second dummy gate electrode extending in the second direction, and being adjacent to the second sidewall.

11. A semiconductor device, comprising:

a first logic cell and a second logic cell on a substrate, the first logic cell and the second logic cell being spaced apart from each other in a first direction;

an isolation region between the first logic cell and the second logic cell;

a first active pattern on the first logic cell and a second active pattern on the second logic cell;

a first channel pattern on the first active pattern, and a second channel pattern on the second active pattern;

a trench on the isolation region;

a first dummy gate electrode adjacent to a first sidewall of the trench and extending in a second direction intersecting the first direction;

a gate electrode extending in the second direction on the first logic cell, and being spaced apart in the first direction from the first dummy gate electrode; and a separation pattern between the gate electrode and the first dummy gate electrode, the separation pattern extending in the second direction, wherein in the first logic cell, the separation pattern is between adjacent first source/drain patterns in the first direction, wherein a first gate spacer is on an upper sidewall of the separation pattern.

12. The semiconductor device of claim 11, further comprising:

a second gate spacer on a sidewall of the gate electrode; and a dummy gate spacer on a sidewall of the first dummy gate electrode, wherein the dummy gate spacer extends along the first sidewall of the trench to contact a top surface of a device isolation layer in a lower portion of the trench.

13. The semiconductor device of claim 12, wherein:

the device isolation layer comprises silicon oxide; and the separation pattern comprises silicon nitride.

14. The semiconductor device of claim 11, wherein the first dummy gate electrode comprises:

a body part on the substrate;

a vertical part that vertically and downwardly extends from the body part along the first sidewall of the trench; and a protruding part that protrudes from the vertical part toward one of the first source/drain patterns.

15. The semiconductor device of claim 11, wherein the trench comprises a second sidewall that faces the first sidewall, and the semiconductor device further comprises a second dummy gate electrode extending in the second direction, and being adjacent to the second sidewall.

16. A semiconductor device, comprising:

a substrate comprising a first logic cell, a second logic cell, and an isolation region between the first logic cell and the second logic cell, the first logic cell and the second logic cell being adjacent to each other in a first direction;

a trench on the isolation region, the trench having a first sidewall adjacent to the first logic cell and a second sidewall adjacent to the second logic cell;

a device isolation layer in a lower portion of the trench;

a first active pattern and a second active pattern in the first logic cell and the second logic cell, respectively;

a plurality of first source/drain patterns and a plurality of second source/drain patterns on the first active pattern and the second active pattern, respectively;

a first channel pattern and a second channel pattern connected to the plurality of first source/drain patterns and the plurality of second source/drain patterns, respectively, each of the first and second channel patterns comprising a first semiconductor pattern, a second semiconductor pattern, and a third semiconductor pattern sequentially stacked and spaced apart from each other;

a first dummy gate electrode on the first sidewall of the trench, the first dummy gate electrode extending in a second direction intersecting the first direction;

a second dummy gate electrode on the second sidewall of the trench, the second dummy gate electrode extending in the second direction;

a first gate electrode and a second gate electrode extending in the second direction across the first channel pattern and the second channel pattern, respectively, each of the first and second gate electrodes comprising a first part between the substrate and the first semiconductor pattern, a second part between the first semiconductor pattern and the second semiconductor pattern, a third part between the second semiconductor pattern and the third semiconductor pattern, and a fourth part on the third semiconductor pattern;

a gate dielectric layer between the first channel pattern and the first gate electrode and between the second channel pattern and the second gate electrode;

a dummy gate dielectric layer between the first channel pattern and the first dummy gate electrode and between the second channel pattern and the second dummy gate electrode;

a first gate spacer on each of sidewalls of the first and second gate electrodes;

a dummy gate spacer on each of sidewalls of the first and second dummy gate electrodes;

a gate capping pattern on each of top surfaces of the first and second gate electrodes;

a first separation pattern extending in the second direction between the first gate electrode and the first dummy gate electrode, wherein, in the first direction, the first separation pattern is between adjacent ones of the plurality of first source/drain patterns;

a first interlayer dielectric layer on the gate capping pattern;

an active contact penetrating the first interlayer dielectric layer, and being coupled to one of the pluralities of first and second source/drain patterns; and a gate contact penetrating the first interlayer dielectric layer, and being coupled to one of the first and second gate electrodes, wherein a top surface of the first separation pattern is at a same level as a top surface of the gate capping pattern.

17. The semiconductor device of claim 16, further comprising a second separation pattern extending in the second direction between the second gate electrode and the second dummy gate electrode.

18. The semiconductor device of claim 17, wherein:

in the first direction, the second separation pattern is between adjacent ones of the plurality of second source/drain patterns.

19. The semiconductor device of claim 16, further comprising a second gate spacer on an upper sidewall of the first separation pattern.

20. The semiconductor device of claim 16, wherein the dummy gate spacer of the first dummy gate electrode extends along the first sidewall of the trench to contact a top surface of the device isolation layer.

* * * * *